US011797135B2

(12) United States Patent
Jeong et al.

(10) Patent No.: US 11,797,135 B2
(45) Date of Patent: Oct. 24, 2023

(54) DISPLAY DEVICE INCLUDING CODE PATTERNS AND TOUCH INPUT SYSTEM INCLUDING THE SAME

(71) Applicant: SAMSUNG DISPLAY CO., LTD., Yongin-si (KR)

(72) Inventors: Ye Ri Jeong, Suwon-si (KR); Hwan Hee Jeong, Cheonan-si (KR); Gyeong Nam Bang, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/823,554

(22) Filed: Aug. 31, 2022

(65) Prior Publication Data
US 2023/0229271 A1 Jul. 20, 2023

(30) Foreign Application Priority Data
Jan. 19, 2022 (KR) .......................... 10-2022-0007711

(51) Int. Cl.
*G06F 3/044* (2006.01)
*G06F 3/041* (2006.01)
*H10K 50/86* (2023.01)
*H10K 59/40* (2023.01)

(52) U.S. Cl.
CPC .......... *G06F 3/0442* (2019.05); *G06F 3/0412* (2013.01); *G06F 3/0446* (2019.05); *G06F 3/0448* (2019.05); *H10K 50/865* (2023.02); *H10K 59/40* (2023.02); *G06F 2203/04112* (2013.01)

(58) Field of Classification Search
CPC .... G06F 3/0412; G06F 3/0442; G06F 3/0446; G06F 3/0448; G06F 2203/04112; H10K 59/40; H10K 59/865
See application file for complete search history.

(56) References Cited

U.S. PATENT DOCUMENTS

| 2008/0036926 | A1 | 2/2008 | Chen et al. |
| 2012/0127114 | A1 | 5/2012 | Weaver |
| 2015/0123935 | A1* | 5/2015 | Park ...................... G06F 3/0448 345/174 |
| 2017/0364194 | A1* | 12/2017 | Jang ...................... H10K 59/131 |

(Continued)

FOREIGN PATENT DOCUMENTS

| CN | 108874220 A | * 11/2018 |
| KR | 10-2014-0126091 | 10/2014 |

(Continued)

*Primary Examiner* — Lisa S Landis
(74) *Attorney, Agent, or Firm* — F. CHAU & ASSOCIATES, LLC

(57) ABSTRACT

A display device includes a display unit including a plurality of light emitting areas, a plurality of touch electrodes disposed between the plurality of light emitting areas to sense a touch, a plurality of light blocking pattern layers formed by covering intersection areas of driving electrodes and sensing electrodes among the plurality of touch electrodes, a plurality of connection electrodes formed on the plurality of light blocking pattern layers to electrically connect the driving electrodes or the sensing electrodes adjacent to each other, and a plurality of code patterns formed of the same material as the plurality of light blocking pattern layers through the same process.

20 Claims, 23 Drawing Sheets

(56) References Cited

U.S. PATENT DOCUMENTS

2018/0004027 A1    1/2018  Lin et al.
2019/0235308 A1*   8/2019  Song ..................... G02B 5/003
2020/0004381 A1    1/2020  Han et al.

FOREIGN PATENT DOCUMENTS

KR    10-2017-0036217    4/2017
KR    10-2018-0036325    4/2018
KR    10-2020-0103220    9/2020

* cited by examiner

DISPLAY DEVICE INCLUDING CODE PATTERNS AND TOUCH INPUT SYSTEM INCLUDING THE SAME

CROSS-REFERENCE TO RELATED APPLICATION

This application claims priority under 35 U.S.C. § 119 to Korean Patent Application No. 10-2022-0007711, filed on Jan. 19, 2022 in the Korean Intellectual Property Office, the contents of which are herein incorporated by reference in its entirety.

TECHNICAL FIELD

The present disclosure relates to a display device and, more particularly, to a display device and a touch input system including the same.

DISCUSSION OF THE RELATED ART

Display devices have been applied to various electronic devices such as smartphones, digital cameras, laptop computers, vehicle navigation devices, and smart televisions. The display device may be a flat panel display device such as a liquid crystal display (LCD) device, a field emission display device, or an organic light emitting diode (OLED) display device. the light emitting diode display device may include a light emitting element in which each pixel of a display panel may emit light by itself, thereby displaying an image without the need for a separate backlight unit, such as may be used in LCD panels.

Display devices often utilize a touch input sensory layer that can detect a touch, such as by a finger of a user or by a stylus/electronic pen. By sensing the touch input using the electronic pen, the display device may more precisely sense the touch input than when using only the touch input using a portion of the user's body, such as a finger.

SUMMARY

A display device includes a display unit including a plurality of light emitting areas; a plurality of touch electrodes disposed between the plurality of light emitting areas to sense a touch; a plurality of light blocking pattern layers formed by covering intersection areas of driving electrodes and sensing electrodes among the plurality of touch electrodes; a plurality of connection electrodes formed on the plurality of light blocking pattern layers to electrically connect the driving electrodes or the sensing electrodes adjacent to each other; and a plurality of code patterns formed of the same material as the plurality of light blocking pattern layers through the same process.

The plurality of code patterns may be formed by covering some of front surfaces of the driving electrodes and the sensing electrodes with a preset planar code shape, or are formed in the preset planar code shape in each code area provided in a plane by forming the driving electrodes and the sensing electrodes in a cut shape.

The planar code shape of the plurality of code patterns may be formed in a closed loop shape of a square, a circle, and/or a rhombus, or may be formed in an open loop shape surrounding a portion of at least one light emitting area among the plurality of light emitting areas, and a shape of a straight line having a preset length.

The driving electrodes, the sensing electrodes, and dummy electrodes may be formed in a mesh structure surrounding between and around the plurality of light emitting areas, and the plurality of light blocking pattern layers may be formed in preset pattern shapes on some of the front surfaces of the driving electrodes, the sensing electrodes, and the dummy electrodes other than the intersection areas of the driving electrodes and the sensing electrodes.

The plurality of connection electrodes may be formed on a front layer of a layer on which the driving electrodes and the sensing electrodes are formed with the light blocking pattern layer interposed therebetween to be electrically insulated from the sensing electrodes, and may be electrically connected to exposed areas of the driving electrodes in which the light blocking pattern layer is not formed on some of the front surfaces and some of the front surfaces are exposed.

The plurality of light blocking pattern layers may be formed and disposed in a shape of a straight line having a preset length, an open loop shape surrounding only a portion of at least one light emitting area among the plurality of light emitting areas, and/or a mesh shape.

The driving electrodes, the sensing electrodes, and the dummy electrodes may be respectively formed in a shape in which some electrodes are cut to form planar code areas in which the electrodes are not formed.

The plurality of code patterns may be respectively formed in a preset position code shape in the planar code areas in which the driving electrodes, the sensing electrodes, and the dummy electrodes are not formed.

The plurality of light blocking pattern layers may be formed by covering front surfaces of the driving electrodes, the sensing electrodes, and the dummy electrodes except for preset shapes and formation areas for the plurality of code patterns.

The plurality of code patterns may be formed in an embossed type in which front surfaces of the driving electrodes, the sensing electrodes, and the dummy electrodes are exposed in a preset position code shape.

A touch input system includes a display device for displaying an image, and a touch input device for inputting a touch to the display device. The display device includes a display unit including a plurality of light emitting areas, a plurality of touch electrodes disposed between the plurality of light emitting areas to sense the touch, a plurality of light blocking pattern layers formed by covering intersection areas of driving electrodes and sensing electrodes among the plurality of touch electrodes, a plurality of connection electrodes formed on the plurality of light blocking pattern layers to electrically connect the driving electrodes or the sensing electrodes adjacent to each other, and a plurality of code patterns formed of the same material as the plurality of light blocking pattern layers through the same process.

The touch input device may include a code detection unit sensing the plurality of code patterns, a code processor receiving shape data for the plurality of code patterns to extract data codes corresponding to shapes of the plurality of code patterns, and generate coordinate data corresponding to the data codes, and a communication module transmitting the coordinate data to the display device.

A display device includes a display unit including a plurality of light emitting areas. A plurality of touch electrodes is disposed between the plurality of light emitting areas to sense a touch. A plurality of connection electrodes is formed on a rear layer of the plurality of touch electrodes with a touch insulating layer interposed therebetween and electrically connecting driving electrodes or sensing electrodes adjacent to each other among the plurality of touch electrodes through a plurality of contact holes. A plurality of light blocking pattern layers is formed in a preset pattern shape on some of front surfaces of the driving electrodes, the sensing electrodes, and dummy electrodes. A plurality of code patterns is formed of the same material as the plurality of light blocking pattern layers through the same process.

The plurality of code patterns may be formed by covering some of front surfaces of the driving electrodes and the sensing electrodes with a preset planar code shape, or may be formed in the preset planar code shape in each code area provided in a plane by forming the driving electrodes and the sensing electrodes in a cut shape.

The driving electrodes, the sensing electrodes, and the dummy electrodes may be formed in a shape in which some electrodes are cut to form planar code areas in which the electrodes are not formed.

The plurality of code patterns may be respectively formed in a preset position code shape in the planar code areas in which the driving electrodes, the sensing electrodes, and the dummy electrodes are not formed.

The plurality of light blocking pattern layers may be formed by covering front surfaces of the driving electrodes, the sensing electrodes, and the dummy electrodes except for preset shapes and formation areas for the plurality of code patterns.

The plurality of code patterns may be formed in an embossed type in which front surfaces of the driving electrodes, the sensing electrodes, and the dummy electrodes are exposed in a preset planar code shape.

A touch input system includes a display device for displaying an image and a touch input device for inputting a touch to the display device. The display device includes a display unit including a plurality of light emitting areas, a plurality of touch electrodes disposed between the plurality of light emitting areas to sense the touch, connection electrodes formed on a rear layer of the plurality of touch electrodes with a touch insulating layer interposed therebetween and electrically connecting driving electrodes or sensing electrodes adjacent to each other among the plurality of touch electrodes through a plurality of contact holes, a plurality of light blocking pattern layers formed in a preset pattern shape on some of front surfaces of the driving electrodes, the sensing electrodes, and dummy electrodes, and a plurality of code patterns formed of the same material as the plurality of light blocking pattern layers through the same process.

The touch input device may include a code detection unit sensing the plurality of code patterns, a code processor receiving shape data for the plurality of code patterns to extract data codes corresponding to shapes of the plurality of code patterns, and generate coordinate data corresponding to the data codes, and a communication module transmitting the coordinate data to the display device.

BRIEF DESCRIPTION OF THE DRAWINGS

The above and other aspects and features of the present disclosure will become more apparent by describing in detail embodiments thereof with reference to the attached drawings, in which.

DETAILED DESCRIPTION OF THE EMBODIMENTS

The present invention will now be described more fully hereinafter with reference to the accompanying drawings, in which embodiments of the invention are shown. This invention may, however, be embodied in different forms and should not necessarily be construed as limited to the embodiments set forth herein. Rather, these embodiments are provided so that this disclosure will be thorough and complete, and will fully convey the scope of the invention to those skilled in the art.

It will also be understood that when a layer is referred to as being "on" another layer or substrate, it can be directly on the other layer or substrate, or intervening layers may also be present. The same reference numbers may indicate the same components throughout the specification and the drawings.

It will be understood that, although the terms "first," "second," etc. may be used herein to describe various elements, these elements should not necessarily be limited by these terms. These terms are used to distinguish one element from another element. For instance, a first element discussed below could be termed a second element without departing from the teachings of the present invention. Similarly, the second element could also be termed the first element.

Each of the features of the various embodiments of the present disclosure may be combined or combined with each other, in part or in whole, and technically various interlocking and driving are possible. Each embodiment may be implemented independently of each other or may be implemented together in an association.

Hereinafter, specific embodiments will be described with reference to the accompanying drawings.

Figure 1:
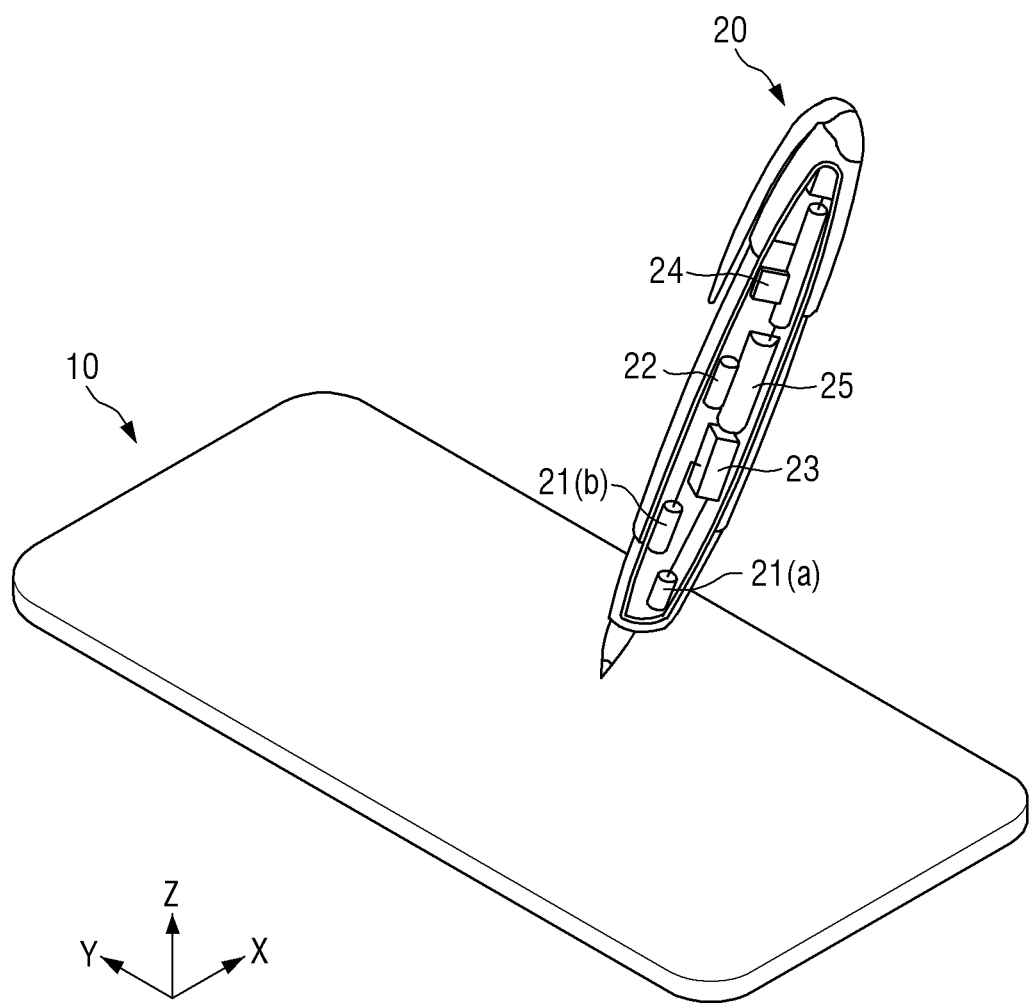
FIG. 1 is a perspective view illustrating a touch input system according to an embodiment of the present disclosure.
Figure 2:
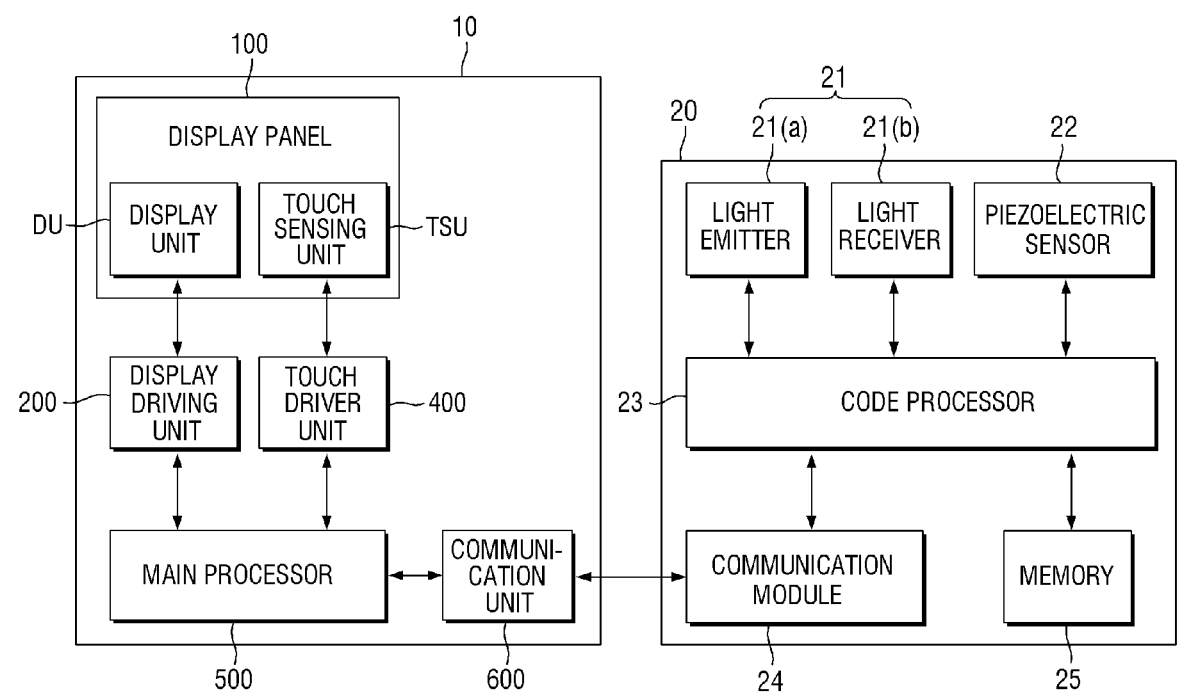
FIG. 2 is a block diagram illustrating a touch input device and a display device illustrated in FIG. 1.

FIG. 1 is a diagram illustrating a touch input system according to an embodiment of the present disclosure. FIG. 2 is a block diagram illustrating a touch input device and a display device illustrated in FIG. 1.

Referring to FIGS. 1 and 2, a display device 10 may be applied to portable electronic devices such as mobile phones, smartphones, tablet personal computers (PCs), mobile communication terminals, electronic notebooks, electronic books, portable multimedia players (PMPs), vehicle navigation devices, and ultra mobile PCs (UMPCs). For example, the display device 10 may be applied to a display unit of televisions, laptop computers, monitors, billboards, or an Internet of Things (JOT) device. For example, the display device 10 may be applied to wearable devices such as smart watches, watch phones, glasses-type displays, and head mounted displays (HMDs).

The display device 10 includes a display panel 100, a display driving unit 200, a touch driving unit 400, a main processor 500, and a communication unit 600. In addition, a touch input device 20 includes a code detection unit 21, a piezoelectric sensor 22, a code processor 23, a communication module 24, and a memory 25.

The display device 10 uses the touch input device 20 as a touch input mechanism. The display panel 100 of the display device 10 may include a display unit DU displaying an image, and a touch sensing unit TSU sensing a touch of a human body part such as a finger and/or the touch input device 20.

The display unit DU of the display panel 100 may include a plurality of pixels and may display an image through the plurality of pixels. The touch sensing unit TSU of the display panel 100 may be formed on a front surface of the display panel 100. The touch sensing unit TSU may include a plurality of touch electrodes to sense a user's touch according to a capacitance. Here, as code patterns are formed on some of the plurality of touch electrodes, the code patterns are sensed by the touch input device 20. For example, as some of the touch electrodes are formed in a cut shape to form code patterns in the code areas provided in a plane, for example, planar code areas in which the touch electrodes are not formed, the code patterns may also be sensed by the touch input device 20.

The code patterns of the display panel 100 are formed of a light blocking pattern layer forming member that forms a preset planar code shape by covering some of the plurality of touch electrodes with a predetermined area. As described above, as some of the touch electrodes are formed in the cut shape, the code patterns may be formed in the preset planar code shape in the code areas in which the touch electrodes are not formed. Accordingly, the code patterns are sensed by the touch input device 20 according to the planar code shape of the light blocking pattern layer forming member and a size of a planar code. A light blocking pattern layer may be formed in the form of a pattern so as not to overlap the code patterns on a portion of the front surface of the plurality of touch electrodes on which the code patterns are not formed. For example, the code patterns may be formed and disposed at preset intervals on a portion of the front surface of some of the plurality of touch electrodes, and the code patterns may also be formed and disposed in code areas formed at preset intervals. A light blocking pattern layer that blocks infrared or ultraviolet light without being sensed by the touch input device 20 may be formed in a pattern type having various shapes on a portion of the front surface of the touch electrodes on which the code patterns are not formed. The light blocking pattern layers of the pattern type may reduce the reflective properties and reflectivity of the touch electrodes by reducing exposed areas of the touch electrodes. Accordingly, it is possible to increase a recognition rate and accuracy of the code patterns of the touch input device 20 by reducing an influence of ambient reflected light. The detailed structures of the code patterns and the light blocking pattern layer as well as the touch sensing unit TSU of the display panel 100 as described above will be described later in more detail with reference to the accompanying drawings.

The display driving unit 200 may output signals and voltages for driving the display unit DU. The display driving unit 200 may supply data voltages to data lines. The display driving unit 200 may supply a power voltage to a power line and may supply gate control signals to a gate driving unit.

The touch driving unit 400 may be electrically connected to the touch sensing unit TSU. The touch driving unit 400 may supply a touch driving signal to a plurality of touch electrodes of the touch sensing unit TSU, and may sense an amount of change in capacitance between the plurality of touch electrodes. The touch driving unit 400 may calculate whether a user's touch input is made and may calculate touch coordinates based on the amount of change in capacitance between the plurality of touch electrodes.

The main processor 500 may control functions of the display device 10. For example, the main processor 500 may supply digital video data to the display driving unit 200 so that the display panel 100 displays an image. For example, the main processor 500 may receive touch data from the touch driving unit 400 to determine the user's touch coordinates, then generate digital video data according to the touch coordinates or execute an application indicated by an icon displayed on the user's touch coordinates. As an example, the main processor 500 receives coordinate data from the touch input device 20 to determine the touch coordinates of the touch input device 20, then generate digital video data according to the touch coordinates or execute an application indicated by an icon displayed on the touch coordinates of the touch input device 20.

The communication unit 600 may perform wired/wireless communication with an external device. For example, the communication unit 600 may transmit and receive communication signals to and from the communication module 24 of the touch input device 20. The communication unit 600 may receive coordinate data composed of data codes from the touch input device 20, and may provide the coordinate data to the main processor 500.

The touch input device 20 may be used as a touch input mechanism and may be configured as an electronic pen such as a stylus or smart pen. The touch input device 20 is an electronic pen that senses display light of the display panel 100 or light reflected from the display panel 100 using an optical type, and may detect a code pattern included in the display panel 100 based on the sensed light and generate the coordinate data. The touch input device 20 may be an electronic pen having a shape of a writing instrument, but is not necessarily limited to the shape or structure of the writing instrument.

The code detection unit 21 of the touch input device 20 is disposed at a position adjacent to a pen tip of the touch input device 20 to sense code patterns included in the display panel 100. The code detection unit 21 includes at least one light emitting unit 21(a) for emitting infrared rays using at least one infrared light source, and at least one light receiving unit 21(b) for detecting infrared rays reflected from the code patterns with an infrared camera.

At least one infrared light source included in the light emitting unit 21(a) may be configured as an infrared LED array having a matrix structure. In addition, the infrared camera of the light receiving unit 21(b) may include a filter that blocks wavelength bands other than the infrared rays and allows the infrared rays to pass therethrough, a lens system for focusing the infrared rays that have passed through the filter, and an optical image sensor that converts an optical image formed by the lens system into an electrical image signal and outputs the converted image signal. Like the infrared LED array, the optical image sensor may be configured as an array having a matrix structure to provide shape data of the code patterns to the code processor 23 according to an infrared shape reflected from the code patterns. In this way, the code detection unit 21 of the touch input device 20 may continuously detect the code patterns included in some areas of the touch sensing unit TSU according to the user's control and movement, and continuously generate the shape data of the code patterns to provide the generated shape data to the code processor 23.

The code processor 23 may continuously receive the shape data of the code patterns from the code detection unit 21. For example, the code processor 23 may continuously receive the shape data for the code patterns, and identify the arrangement structure and shape of the code patterns. The code processor 23 may extract or generate a data code corresponding to the arrangement structure and shape of the code patterns, and may extract or generate coordinate data corresponding to the combined data code by combining the data codes. The code processor 23 may transmit the generated coordinate data to the display device 10 through the communication module 24. In particular, the code processor 23 may receive the shape data of the code pattern unit to generate and convert the data codes corresponding to the code patterns, respectively, thereby quickly generating the coordinate data without complicated calculation and correction.

The communication module 24 may perform wired/wireless communication with an external device. For example, the communication module 24 may transmit and receive communication signals to and from the communication unit 600 of the display device 10. The communication module 24 may receive the coordinate data composed of the data codes from the code processor 23, and may provide the coordinate data to the communication unit 600.

The memory 25 may store data necessary for driving the touch input device 20. The memory 25 stores shape data of the code patterns and data codes corresponding to the respective shape data and code patterns, respectively. In addition, the memory 25 stores data codes and coordinate data according to a combination of data codes. The memory 25 shares the data codes corresponding to the respective shape data and code patterns, respectively, and the coordinate data according to the combination of the data codes with the code processor 23. Accordingly, the code processor 23 may combine the data codes through the data codes and the coordinate data stored in the memory 25, and may extract or generate coordinate data corresponding to the combined data code.

Figure 3:
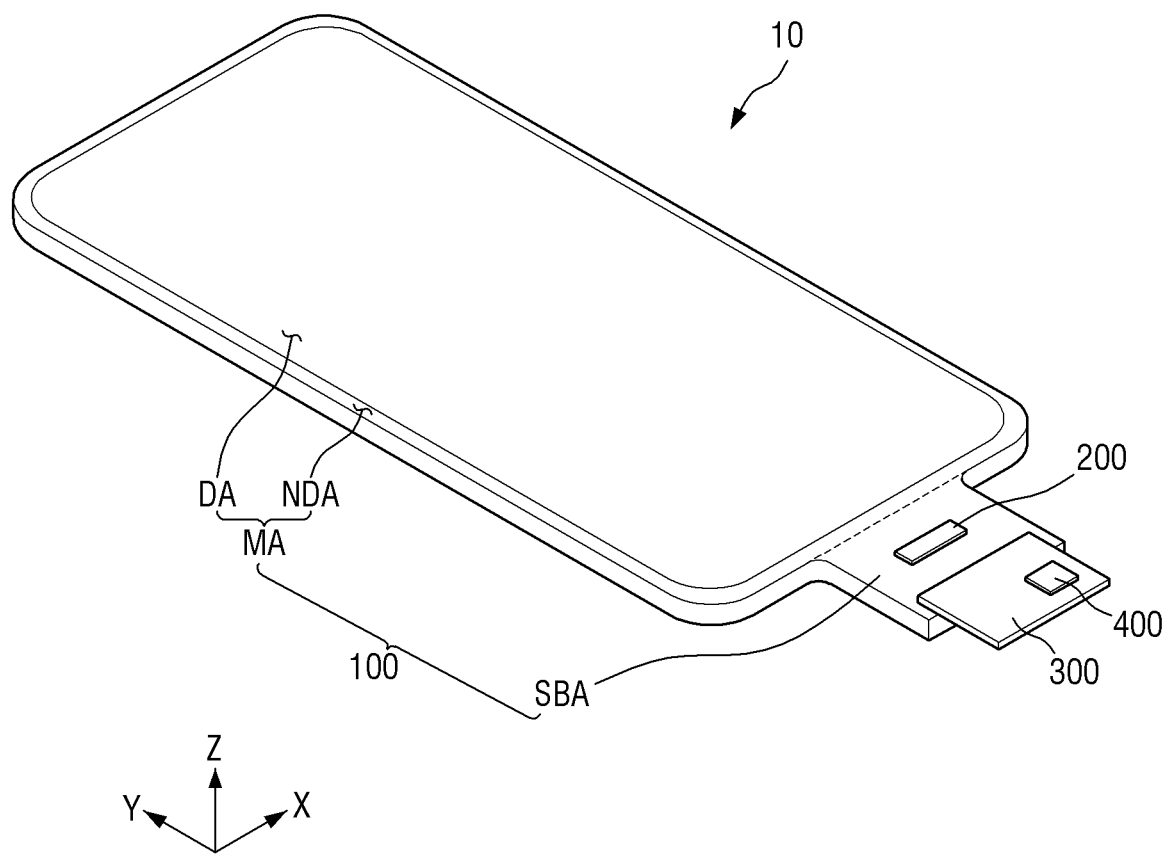
FIG. 3 is a perspective view illustrating a configuration of the display device illustrated in FIG. 2.

FIG. 3 is a perspective view illustrating a configuration of the display device illustrated in FIG. 2. In addition, FIG. 4 is a cross-sectional view illustrating a configuration of the display device illustrated in FIG. 2.

Figure 4:
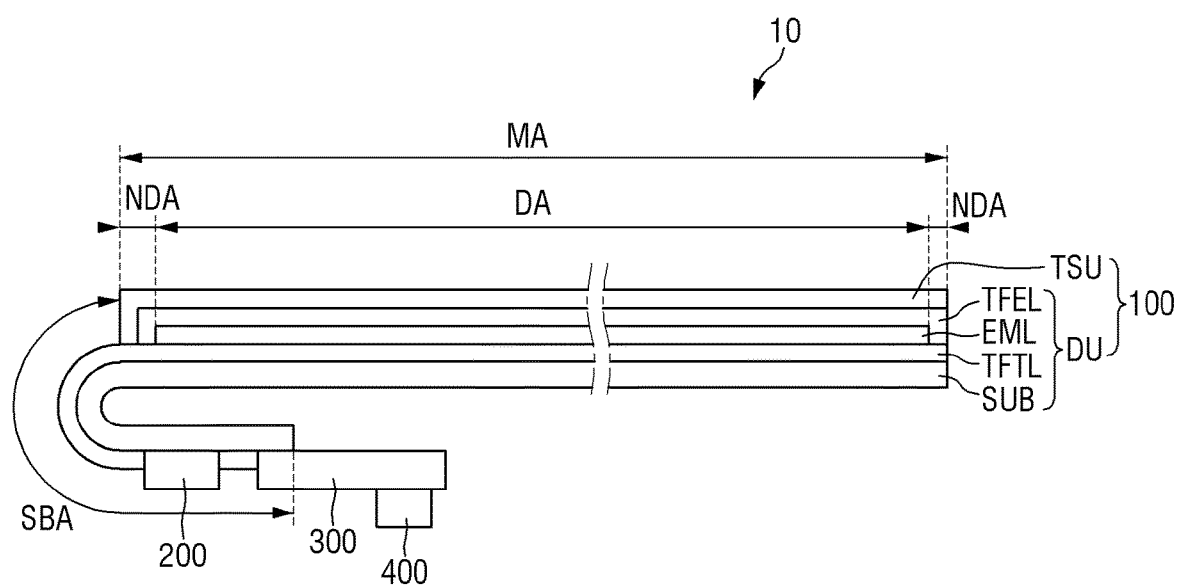
FIG. 4 is a cross-sectional view illustrating a configuration of the display device illustrated in FIG. 2.

Referring to FIGS. 3 and 4, the display device 10 may have a planar shape that is similar to a quadrilateral. For example, the display device 10 may have a planar shape similar to a quadrilateral having a pair of short sides extending in an X-axis direction and a pair of long sides extending in a Y-axis direction. A corner where the short side in the X-axis direction and the long side in the Y-axis direction meet may be rounded to have a predetermined curvature or may be formed at a right angle. The planar shape of the display device 10 is not necessarily limited to the quadrilateral, and may be formed similarly to other polygons, circles, or ovals.

The display panel 100 may include a main area MA and a sub-area SBA.

The main area MA may include a display area DA including pixels displaying an image, and a non-display area NDA at least partially surrounding the display area DA. The display area DA may emit light from a plurality of light emitting areas or a plurality of opening areas. For example, the display panel 100 may include a pixel circuit including switching elements, a pixel defining layer defining a light emitting area or an opening area, and a self-light emitting element.

The non-display area NDA may be an area outside the display area DA. The non-display area NDA may be defined as an edge area of the main area MA of the display panel 100. The non-display area NDA may include a gate driving unit supplying gate signals to the gate lines, and fan-out lines connecting the display driving unit 200 and the display area DA.

The sub-area SBA may extend from one side of the main area MA. The sub-area SBA may include a flexible material that may be bent, folded, rolled, or the like, to a noticeable degree without cracking or otherwise sustaining damage. For example, when the sub-area SBA is bent, the sub-area SBA may overlap the main area MA in a thickness direction (Z-axis direction). The sub-area SBA may include the display driving unit 200 and a pad portion connected to a circuit board 300. Optionally, the sub-area SBA may be omitted, and the display driving unit 200 and the pad portion may be disposed in the non-display area NDA.

The display driving unit 200 may be formed as an integrated circuit (IC) and mounted on the display panel 100 by a chip on glass (COG) method, a chip on plastic (COP) method, or an ultrasonic bonding method. For example, the display driving unit 200 may be disposed in the sub-area SBA, and may overlap the main area MA in the thickness direction (Z-axis direction) by bending of the sub-area SBA. As an example, the display driving unit 200 may be mounted on the circuit board 300.

The circuit board 300 may be attached to the pad portion of the display panel 100 using an anisotropic conductive film (ACF). Lead lines of the circuit board 300 may be electrically connected to the pad portion of the display panel 100. The circuit board 300 may be a flexible film such as a flexible printed circuit board, a printed circuit board, or a chip on film.

The touch driving unit 400 may be mounted on the circuit board 300. The touch driving unit 400 may be formed as an integrated circuit (IC). As described above, the touch driving unit 400 may supply the touch driving signal to the plurality of touch electrodes of the touch sensing unit TSU, and may sense the amount of change in capacitance between the plurality of touch electrodes. Here, the touch driving signal may be a pulse signal having a predetermined frequency. The touch driving unit 400 calculates whether a touch input of a user's body part, such as a finger is made and touch coordinates based on the amount of change in capacitance between the plurality of touch electrodes.

Referring to FIG. 4, the display panel 100 may include a display unit DU, a touch sensing unit TSU, and a polarizing film. The display unit DU may include a substrate SUB, a thin film transistor layer TFTL, a light emitting element layer EML, and an encapsulation layer TFEL.

The substrate SUB may be a base substrate or a base member. The substrate SUB may be a flexible substrate that may be bent, folded, and rolled to a noticeable extent without cracking or otherwise sustaining damage. For example, the substrate SUB may include a glass material or a metal material, but is not necessarily limited thereto. As an example, the substrate SUB may include a polymer resin such as polyimide PI.

The thin film transistor layer TFTL may be disposed on the substrate SUB. The thin film transistor layer TFTL may include a plurality of thin film transistors constituting a pixel circuit of pixels. The thin film transistor layer TFTL may further include gate lines, data lines, power lines, gate control lines, fan-out lines connecting the display driving unit 200 and the data lines, and lead lines connecting the display driving unit 200 and the pad portion. When the gate driving unit is formed on one side of the non-display area NDA of the display panel 100, the gate driving unit may also include the thin film transistors.

The thin film transistor layer TFTL may be disposed in the display area DA, the non-display area NDA, and the sub-area SBA. The thin film transistors, the gate lines, the data lines, and the power lines of each of the pixels of the thin film transistor layer TFTL may be disposed in the display area DA. The gate control lines and the fan-out lines of the thin film transistor layer TFTL may be disposed in the non-display area NDA. The lead lines of the thin film transistor layer TFTL may be disposed in the sub-area SBA.

The light emitting element layer EML may be disposed on the thin film transistor layer TFTL. The light emitting element layer EML may include a plurality of light emitting elements in which a first electrode, a light emitting layer, and a second electrode are sequentially stacked to emit light, and a pixel defining layer defining pixels. The plurality of light emitting elements of the light emitting element layer EML may be disposed in the display area DA. The light emitting layer may be an organic light emitting layer including an organic material. The light emitting layer may include a hole transporting layer, an organic light emitting layer, and an electron transporting layer. When the first electrode receives a predetermined voltage through the thin film transistor of the thin film transistor layer TFTL, and the second electrode receives a cathode voltage, holes and electrons may move to the organic light emitting layer through the hole transporting layer and the electron transporting layer, respectively, and may be combined with each other in the organic light emitting layer to emit light. For example, the first electrode may be an anode electrode and the second electrode may be a cathode electrode, but is not necessarily limited thereto.

As an example, the plurality of light emitting elements may include a quantum dot light emitting diode including a quantum dot light emitting layer or an inorganic light emitting diode including an inorganic semiconductor.

The encapsulation layer TFEL may cover a top surface and side surfaces of the light emitting element layer EML, and may protect the light emitting element layer EML from an ambient environment. The encapsulation layer TFEL may include at least one inorganic layer and at least one organic layer for encapsulating the light emitting element layer EML.

The touch sensing unit TSU may be disposed on the encapsulation layer TFEL. The touch sensing unit TSU may include a plurality of touch electrodes for sensing a user's touch in a capacitance type, and touch lines connecting the plurality of touch electrodes and the touch driving unit 400. For example, the touch sensing unit TSU may sense a user's touch in a self-capacitance type or a mutual capacitance type.

As an example, the touch sensing unit TSU may be disposed on a separate substrate disposed on the display unit DU. In this case, the substrate supporting the touch sensing unit TSU may be a base member that encapsulates the display unit DU.

The plurality of touch electrodes of the touch sensing unit TSU may be disposed in a touch sensor area overlapping the display area DA. The touch lines of the touch sensing unit TSU may be disposed in a touch peripheral area overlapping the non-display area NDA.

The sub-area SBA of the display panel 100 may extend from one side of the main area MA. The sub-area SBA may include a flexible material that may be bent, folded, rolled, or the like to a noticeable degree without cracking or otherwise sustaining damage. For example, when the sub-area SBA is bent, the sub-area SBA may overlap the main area MA in the thickness direction (Z-axis direction). The sub-area SBA may include the display driving unit 200 and the pad portion connected to a circuit board 300.

Figure 5:
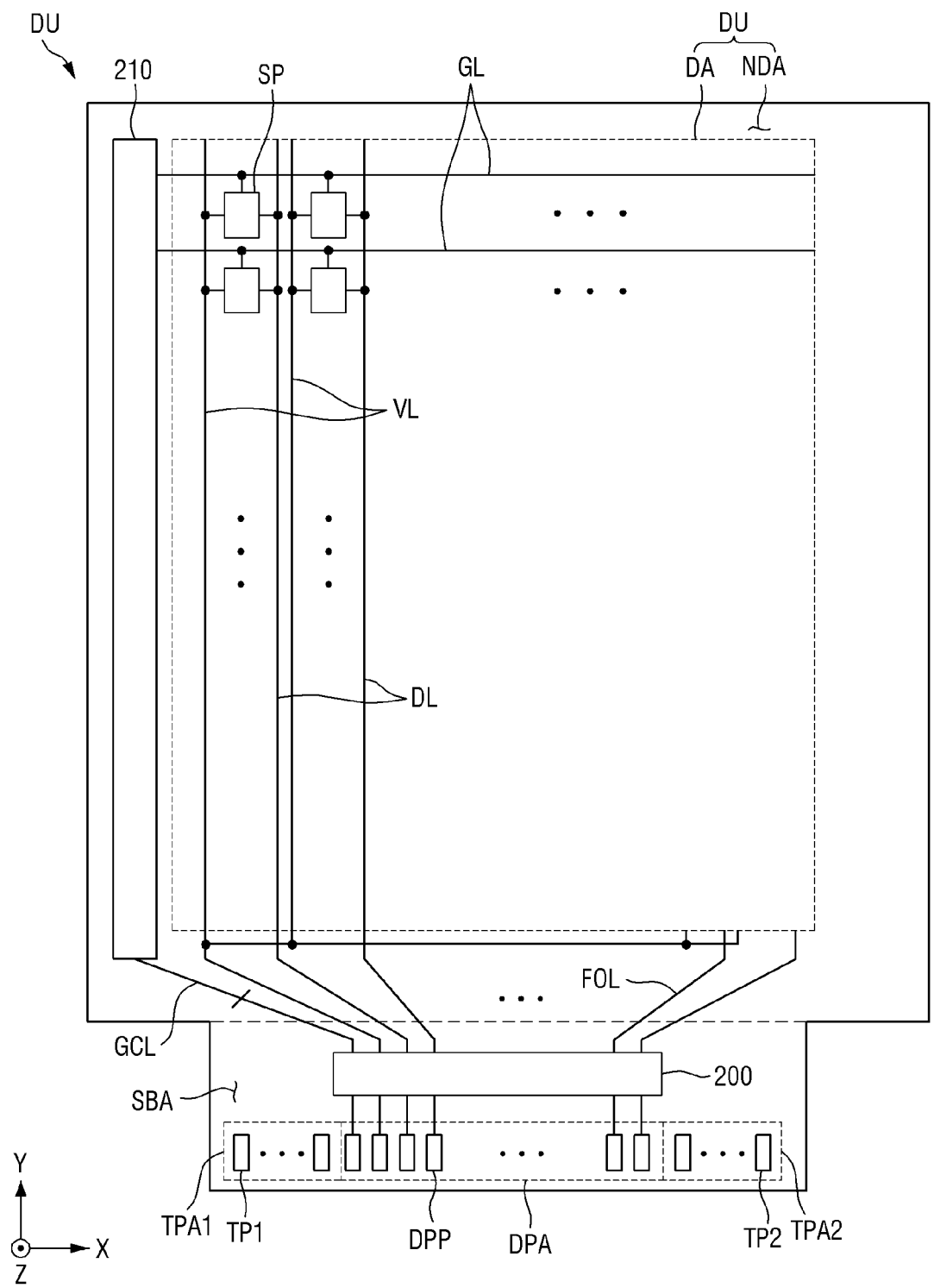
FIG. 5 is a plan view illustrating a display unit of the display device according to an embodiment.

FIG. 5 is a plan view illustrating a display unit of the display device according to an embodiment.

Referring to FIG. 5, the display area DA of the display unit DU is an area for displaying an image and may be defined as a central area of the display panel 100. The display area DA may include a plurality of pixels SP, a plurality of gate lines GL, a plurality of data lines DL, and a plurality of power lines VL. Each of the plurality of pixels SP may be defined as a minimum unit for outputting light and displaying an image.

The plurality of gate lines GL may supply the gate signal received from the gate driving unit 210 to the plurality of pixels SP. The plurality of gate lines GL may extend in the X-axis direction and may be spaced apart from each other in the Y-axis direction, intersecting the X-axis direction.

The plurality of data lines DL may supply the data voltage received from the display driving unit 200 to the plurality of pixels SP. The plurality of data lines DL may extend in the Y-axis direction and may be spaced apart from each other in the X-axis direction.

The plurality of power lines VL may supply the power voltage received from the display driving unit 200 to the plurality of pixels SP. Here, the power voltage may be a driving voltage, an initialization voltage, and/or a reference voltage. The plurality of power lines VL may extend in the Y-axis direction and may be spaced apart from each other in the X-axis direction.

The non-display area NDA of the display unit DU may at least partially surround the display area DA. The non-display area NDA may include a gate driving unit 210, fan-out lines FOL, and gate control lines GCL. The gate driving unit 210 may generate a plurality of gate signals based on the gate control signal, and may sequentially supply the plurality of gate signals to the plurality of gate lines GL according to a set order.

The fan-out lines FOL may extend from the display driving unit 200 to the display area DA. The fan-out lines FOL may supply the data voltage received from the display driving unit 200 to the plurality of data lines DL.

The gate control line GCL may extend from the display driving unit 200 to the gate driving unit 210. The gate control line GCL may supply the gate control signal received from the display driving unit 200 to the gate driving unit 210.

The sub-area SBA may include a display driving unit 200, a display pad area DPA, and first and second touch pad areas TPA1 and TPA2.

The display driving unit 200 may output signals and voltages for driving the display panel 100 to the fan-out lines FOL. The display driving unit 200 may supply the data voltage to the data lines DL through the fan-out lines FOL. The data voltage may be supplied to the plurality of pixels SP and may determine luminance of the plurality of pixels SP. The display driving unit 200 may supply the gate control signal to the gate driving unit 210 through the gate control line GCL.

The display pad area DPA, the first touch pad area TPA1, and the second touch pad area TPA2 may be disposed at an edge of the sub-area SBA. The display pad area DPA, the first touch pad area TPA1, and the second touch pad area TPA2 may be electrically connected to the circuit board 300 using an anisotropic conductive film or a low-resistance and high-reliability material such as SAP.

The display pad area DPA may include a plurality of display pad portions DPP. The plurality of display pad portions DPP may be electrically connected to the main processor 500 through the circuit board 300. The plurality of display pad portions DPP may be electrically connected to the circuit board 300 to receive digital video data, and may supply the digital video data to the display driving unit 200.

Figure 6:
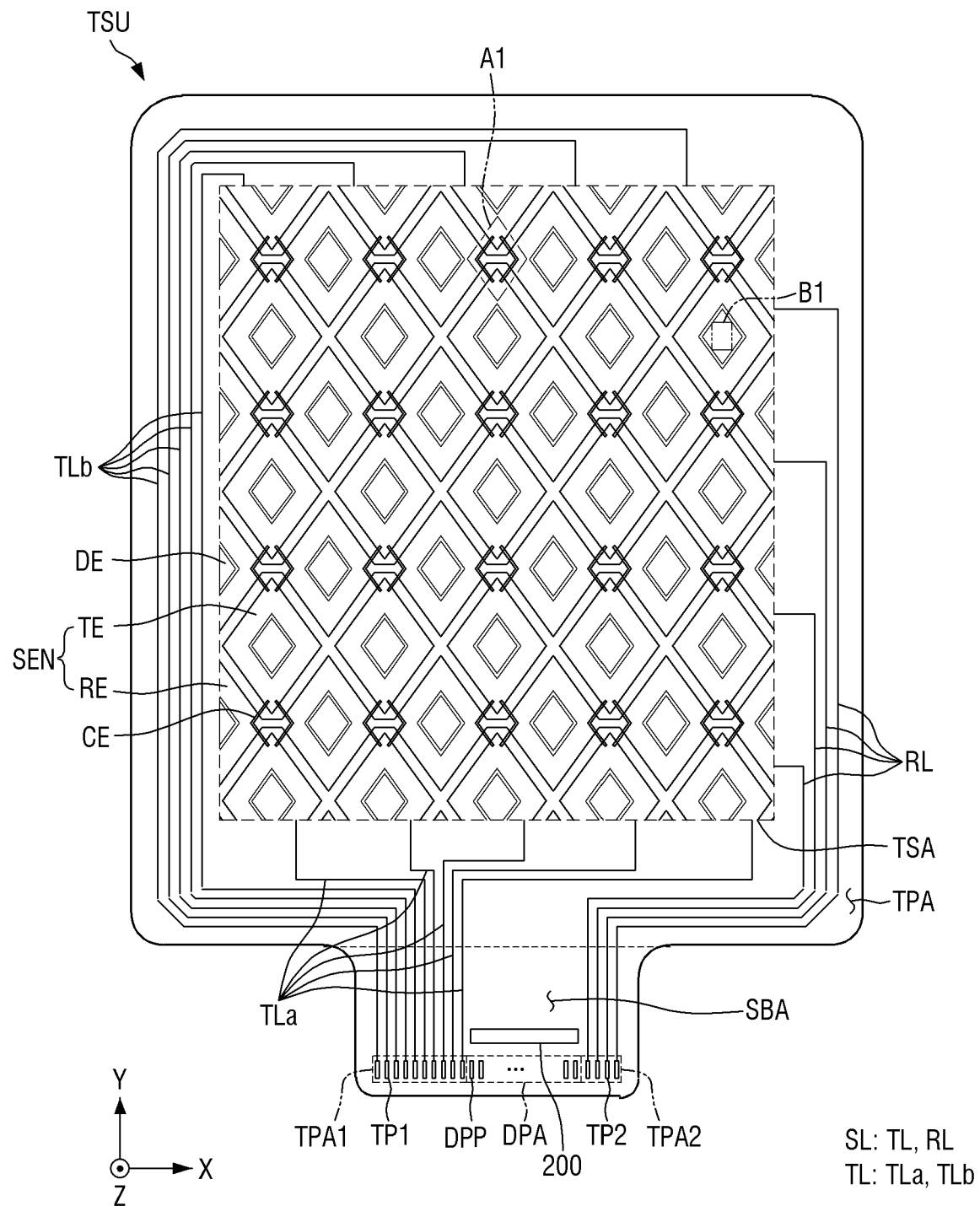
FIG. 6 is a plan view illustrating a touch sensing unit of the display device according to an embodiment.

FIG. 6 is a plan view illustrating a touch sensing unit of the display device according to an embodiment.

Referring to FIG. 6, the touch sensing unit TSU may include a touch sensor area TSA for sensing a user's touch, and a touch peripheral area TPA at least partially surrounding the touch sensor area TSA. The touch sensor area TSA may overlap the display area DA of the display unit DU, and the touch peripheral area TPA may overlap the non-display area NDA of the display unit DU.

The touch sensor area TSA may include a plurality of touch electrodes SEN and a plurality of dummy electrodes DE. The plurality of touch electrodes SEN may form mutual capacitance or self capacitance to sense a touch of an object or a person. The plurality of touch electrodes SEN may include a plurality of driving electrodes TE and a plurality of sensing electrodes RE.

The plurality of driving electrodes TE may be arranged in the X-axis direction and the Y-axis direction. The plurality of driving electrodes TE may be spaced apart from each other in the X-axis direction and the Y-axis direction. The driving electrodes TE adjacent to each other in the Y-axis direction may be electrically connected to each other through a plurality of connection electrodes CE.

The plurality of driving electrodes TE may be electrically connected to a first touch pad portion TP1 through a driving line TL. The driving line TL may include a lower driving line TLa and an upper driving line TLb. For example, some of the driving electrodes TE disposed on a lower side of the touch sensor area TSA may be electrically connected to the first touch pad portion TP1 through the lower driving line TLa, and other driving electrodes TE disposed on an upper side of the touch sensor area TSA may be electrically connected to the first touch pad portion TP1 through the upper driving line TLb. The lower driving line TLa may pass through a lower side of the touch peripheral area TPA and extend to the first touch pad portion TP1. The upper driving line TLb may extend to the first touch pad portion TP1 via upper, left, and lower sides of the touch peripheral area TPA. The first touch pad portion TP1 may be electrically connected to the touch driving unit 400 through the circuit board 300.

The connection electrodes CE may be disposed on a layer different from that of the plurality of driving electrodes TE and the plurality of sensing electrodes RE. For example, the connection electrodes CE may be disposed on a front layer on which the plurality of driving electrodes TE and the sensing electrodes RE are formed, and may also be disposed on a rear layer on which the plurality of driving electrodes TE and sensing electrodes RE are formed. The connection electrode CE may be bent at least once. For example, the connection electrode CE may have a clamp shape ("<" or ">"), but the shape of the connection electrode CE in a plan view is not necessarily limited thereto. The driving electrodes TE adjacent to each other in the Y-axis direction may be electrically connected to each other by the plurality of connection electrodes CE, and even if any one of the plurality of connection electrodes CE is disconnected, the driving electrodes TE may be stably connected to each other through the remaining connection electrodes CE. The driving electrodes TE adjacent to each other may be electrically connected by two connection electrodes CE, but the number of connection electrodes CE is not necessarily limited thereto.

For example, the connection electrodes CE may be formed on a front layer (or an upper layer) that is different from the layer on which the driving electrodes TE and the sensing electrodes RE are formed. The connection electrodes CE may be formed on the front layers of the driving electrodes TE and the sensing electrodes RE with a light blocking pattern layer for insulation and light blocking interposed therebetween. The connection electrodes CE may be electrically connected to the driving electrodes TE on the rear surface adjacent to each other through a plurality of contact holes, or may be electrically connected to the driving electrodes TE on the rear surface of which the light blocking pattern layer is not formed and the front surface is exposed. Accordingly, even if the connection electrodes CE overlap the plurality of sensing electrodes RE in the Z-axis direction (front or rear direction), the plurality of driving electrodes TE and the plurality of sensing electrodes RE may be electrically insulated from each other. Mutual capacitance may be formed between the driving electrode TE and the sensing electrode RE.

For example, the connection electrodes CE may be formed on a rear layer (or a lower layer) from the layer on which the driving electrodes TE and the sensing electrodes RE are formed. The connection electrodes CE may be disposed on the rear layers of the driving electrodes TE and the sensing electrodes RE with an insulating layer or a light blocking pattern layer interposed therebetween. The driving electrodes TE adjacent to each other in the Y-axis direction may be electrically connected to each other through the respective connection electrodes CE disposed on the rear layer. The driving electrodes TE are electrically connected to the connection electrodes CE and the adjacent driving electrodes TE through a plurality of contact holes. Accordingly, even if the connection electrodes CE overlap the plurality of sensing electrodes RE in the Z-axis direction, the plurality of driving electrodes TE and the plurality of sensing electrodes RE may be electrically insulated from each other. Mutual capacitance may be formed between the driving electrode TE and the sensing electrode RE.

The sensing electrodes RE adjacent to each other in the X-axis direction may be electrically connected to each other through a connection portion disposed on the same layer. For example, the plurality of sensing electrodes RE may extend in the X-axis direction and may be spaced apart from each other in the Y-axis direction. The plurality of sensing electrodes RE may be arranged in the X-axis direction and the Y-axis direction, and the sensing electrodes RE adjacent in the X-axis direction may be electrically connected to each other in an extended from the connection portion.

The plurality of sensing electrodes RE may be electrically connected to a second touch pad portion TP2 through a sensing line RL. For example, some of the sensing electrodes RE disposed on the right side of the touch sensor area TSA may be electrically connected to the second touch pad portion TP2 through the sensing line RL. The sensing line RL may extend to the second touch pad portion TP2 via the right and lower sides of the touch peripheral area TPA. The second touch pad portion TP2 may be electrically connected to the touch driving unit 400 through the circuit board 300.

Each of the plurality of dummy electrodes DE may be surrounded by the driving electrode TE or the sensing electrode RE. Each of the plurality of dummy electrodes DE may be spaced apart from and electrically insulated from the driving electrode TE or the sensing electrode RE. Accordingly, the dummy electrode DE may be electrically floating.

Code patterns in a shape of a planar code are formed at predetermined intervals on at least some areas of the front surface of the plurality of driving electrodes TE, the plurality of sensing electrodes RE, and/or the plurality of dummy electrodes DE. The code patterns are formed by being patterned with the same material as the light blocking pattern layer when the light blocking pattern layer is formed to insulate the connection electrodes CE. In addition, the light blocking pattern layer may be further formed so as not to overlap the code patterns on a portion of the front surface of the plurality of touch electrodes SEN and the plurality of dummy electrodes DE on which the code patterns are not formed. In particular, the light blocking pattern layer may be formed in various pattern shapes on a portion of the front surface of the plurality of touch electrodes SEN and the plurality of dummy electrodes DE, in addition to the area overlapping the connection electrodes CE, for example, an intersecting area between the driving electrodes TE and the sensing electrodes RE in order to insulate the connection electrodes CE.

The display pad area DPA, the first touch pad area TPA1, and the second touch pad area TPA2 may be disposed at an edge of the sub-area SBA. The display pad area DPA, the first touch pad area TPA1, and the second touch pad area TPA2 may be electrically connected to the circuit board 300 using an anisotropic conductive film or a low-resistance and high-reliability material such as SAP.

The first touch pad area TPA1 may be disposed on one side of the display pad area DPA and may include a plurality of first touch pad portions TP1. The plurality of first touch pad portions TP1 may be electrically connected to the touch driving unit 400 disposed on the circuit board 300. The plurality of first touch pad portions TP1 may supply a touch driving signal to the plurality of driving electrodes TE through the plurality of driving lines TL.

The second touch pad area TPA2 may be disposed on the other side of the display pad area DPA and may include a plurality of second touch pad portions TP2. The plurality of second touch pad portions TP2 may be electrically connected to the touch driving unit 400 disposed on the circuit board 300. The touch driving unit 400 may receive a touch sensing signal through the plurality of sensing lines RL connected to the plurality of second touch pad portions TP2, and may sense a change in mutual capacitance between the driving electrode TE and the sensing electrode RE.

As an example, the touch driving unit 400 may supply a touch driving signal to each of the plurality of driving electrodes TE and the plurality of sensing electrodes RE, and may receive a touch sensing signal from each of the plurality of driving electrodes TE and the plurality of sensing electrodes RE. The touch driving unit 400 may sense a charge change amount of each of the plurality of driving electrodes TE and the plurality of sensing electrodes RE based on the touch sensing signal.

Figure 7:
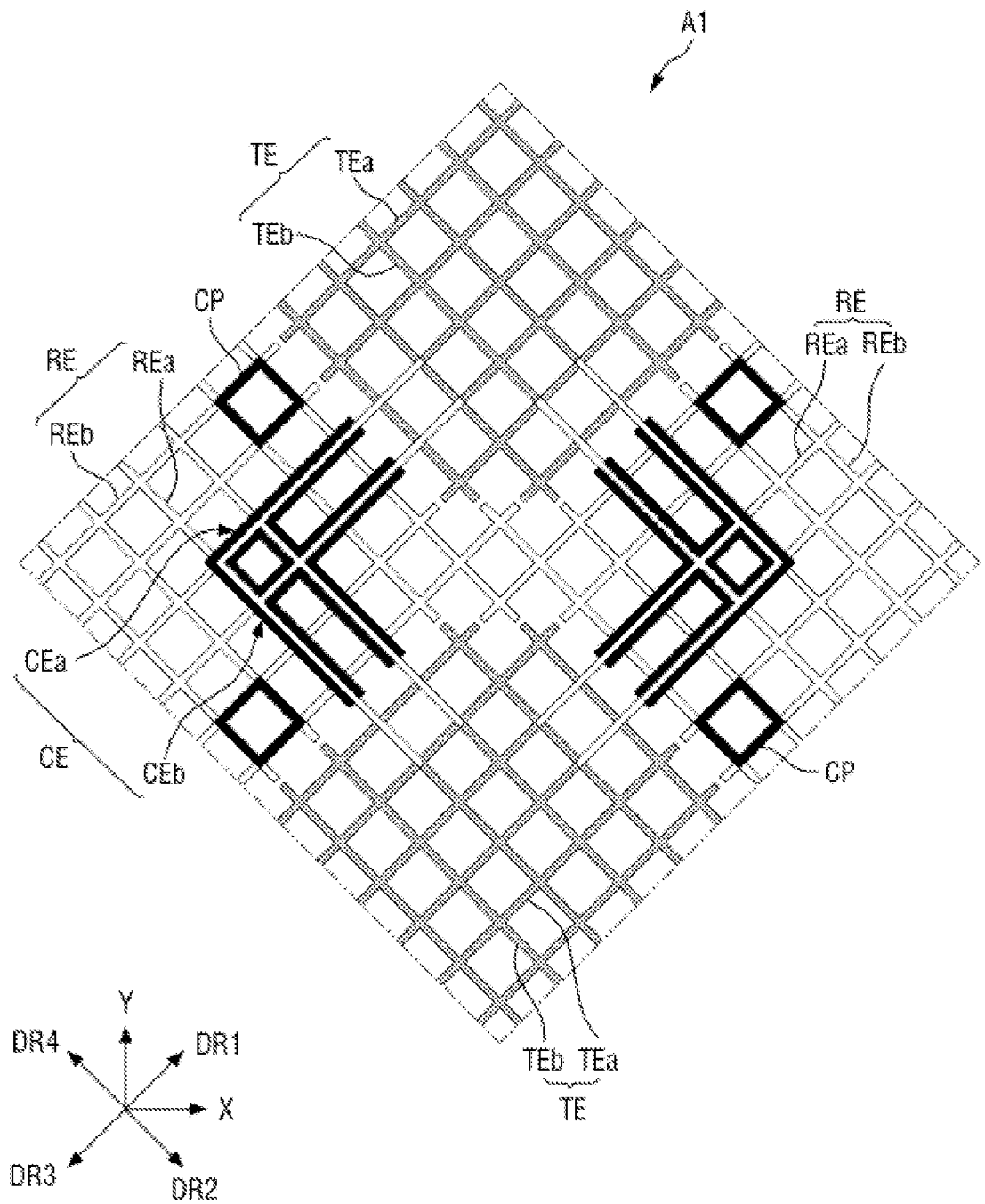
FIG. 7 is an enlarged view of area A1 illustrated in FIG. 6.
Figure 8:
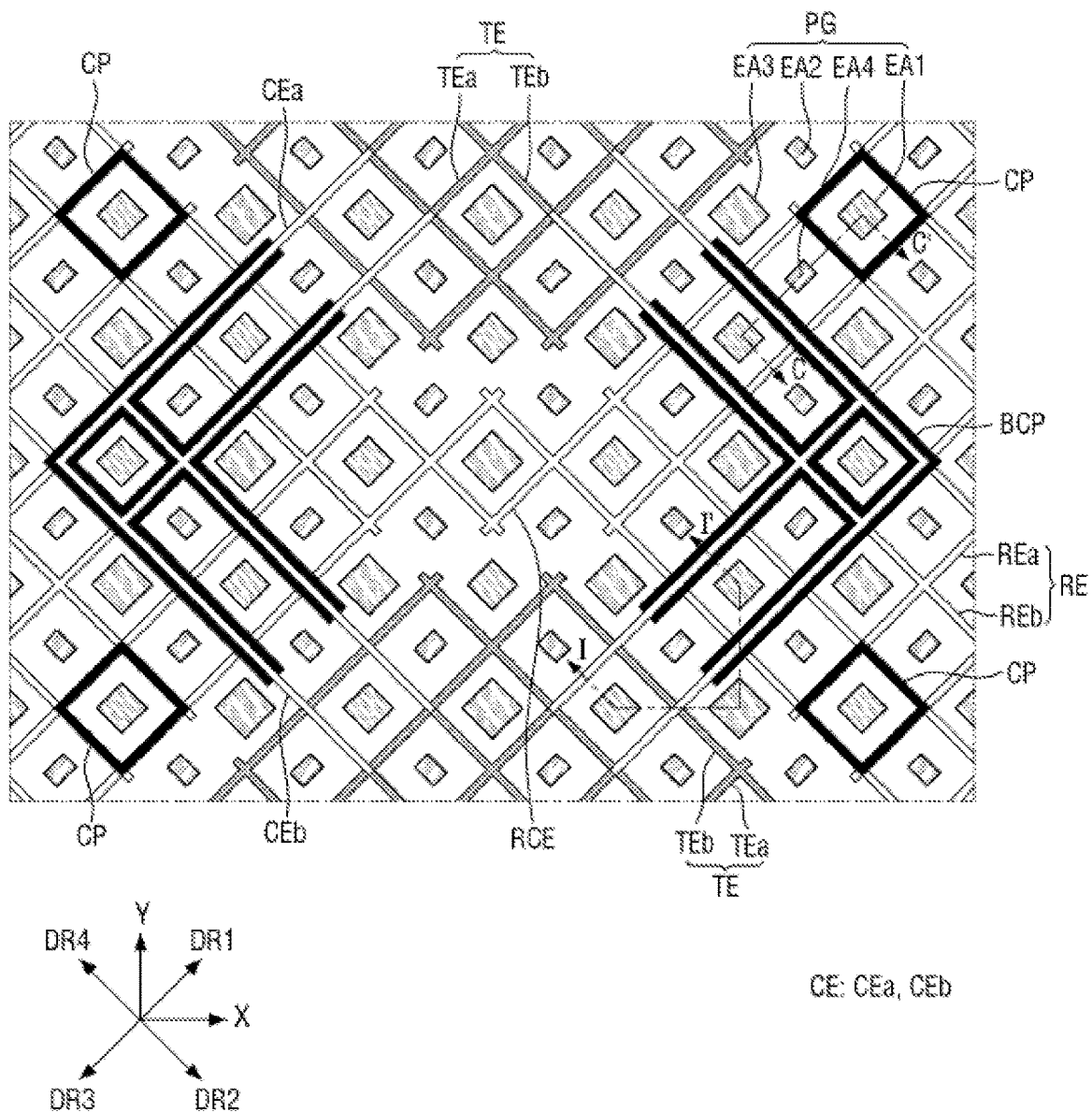
FIG. 8 is an enlarged view illustrating an area A1 in which code patterns are disposed according to an embodiment.

FIG. 7 is an enlarged view of area A1 illustrated in FIG. 6. In addition, FIG. 8 is an enlarged view illustrating an area A1 in which code patterns are disposed according to an embodiment.

Referring to 7 and 8, the plurality of driving electrodes TE, the plurality of sensing electrodes RE, and the plurality of dummy electrodes DE may be disposed on the same layer and may be spaced apart from each other.

The plurality of driving electrodes TE may be arranged in the X-axis direction and the Y-axis direction. The plurality of driving electrodes TE may be spaced apart from each other in the X-axis direction and the Y-axis direction. The driving electrodes TE adjacent to each other in the Y-axis direction may be electrically connected to each other through the connection electrodes CE formed on the front surface thereof with a light blocking pattern layer BCP interposed therebetween. The connection electrodes CE are electrically insulated from the sensing electrodes RE by the light blocking pattern layer BCP. The connection electrodes CE may be electrically connected to exposed areas mCT of the driving electrodes TE, the front surface of which is exposed because the light blocking pattern layer BCP is not formed on a portion of the front surface.

The plurality of sensing electrodes RE may extend in the X-axis direction and may be spaced apart from each other in the Y-axis direction. The plurality of sensing electrodes RE may be arranged in the X-axis direction and the Y-axis direction, and the sensing electrodes RE adjacent to each other in the X-axis direction may be electrically connected to each other. For example, the sensing electrodes RE may be electrically connected to each other through a connection portion RCE, and the connection portion RCE may be disposed within the shortest distance between the driving electrodes TE adjacent to each other.

The plurality of connection electrodes CE may be disposed on a layer different from that of the driving electrode TE and the sensing electrode RE, for example, a front layer. The connection electrode CE may include a first portion CEa and a second portion CEb. For example, the first portion CEa of the connection electrode CE may be in contact with the exposed areas mCT of the one side driving electrodes TE in which the light blocking pattern layer BCP is not formed and the front surface thereof is exposed, and may extend in the third direction DR3. The second portion CEb of the connection electrode CE may be bent from the first portion CEa in an area overlapping the sensing electrode RE to extend in the second direction DR2, and may be electrically connected to the driving electrode TE disposed on the other side through the exposed areas mCT of the driving electrodes TE in which the light blocking pattern layer BCP is not formed and the front surface thereof is exposed. Hereinafter, the first direction DR1 may refer to a direction between the X-axis direction and the Y-axis direction, the second direction DR2 may refer to a direction between a direction opposite to the Y-axis direction and the X-axis direction, the third direction DR3 may refer to a direction opposite to the first direction DR1, and the fourth direction DR4 may refer to a direction opposite to the second direction DR2. Accordingly, each of the plurality of connection electrodes CE may connect the driving electrodes TE adjacent to each other in the Y-axis direction.

The plurality of pixels may include first to third sub-pixels or first to fourth sub-pixels, and each of the first to fourth sub-pixels may include first to fourth light emitting areas EA1, EA2, EA3, and EA4. For example, the first light emitting area EA1 may emit light of a first color (e.g., red light), the second light emitting area EA2 may emit light of a second color (e.g., green light), and the third light emitting area EA3 may emit light of a third color (e.g., blue light). In addition, the fourth light emitting area EA4 may emit light of a fourth color (e.g., light of any one of the first to third colors), but is not necessarily limited thereto.

One pixel group PG may express a white light through the first to third light emitting areas EA1 to EA3 or the first to fourth light emitting areas EA1 to EA4. In addition, gray-scales of various colors, such as white, may be expressed by a combination of light emitted from the first to third light emitting areas EA1 to EA3 or the first to fourth light emitting areas EA1 to EA4.

According to an arrangement structure of the first to third sub-pixels or the first to fourth sub-pixels, the plurality of driving electrodes TE, the plurality of sensing electrodes RE, and the plurality of dummy electrodes DE may be formed in a mesh structure or a net structure in a plan view.

The plurality of driving electrodes TE, the plurality of sensing electrodes RE, and the plurality of dummy electrodes DE may at least partially surround each of the first to third light emitting areas EA1 to EA3 or the first to fourth light emitting areas EA1 to EA4 included in the pixel group PG in a plan view. Therefore, the plurality of driving electrodes TE, the plurality of sensing electrodes RE, and the plurality of dummy electrodes DE might not overlap the first to fourth light emitting areas EA1 to EA4. The plurality of connection electrodes CE might also not overlap the first to fourth light emitting areas EA1 to EA4. Therefore, the display device 10 may prevent luminance of the light emitted from the first to fourth light emitting areas EA1 to EA4 from being reduced by the touch sensing unit TSU.

Each of the plurality of driving electrodes TE may include a first portion TEa extending in the first direction DR1 and a second portion TEb extending in the second direction DR2 and might not overlap the first to fourth light emitting areas EA1 to EA4. In addition, each of the plurality of sensing electrodes RE may include a first portion REa extending in the first direction DR1 and a second portion REb extending in the second direction DR2 and might not overlap the first to fourth light emitting areas EA1 to EA4. The plurality of dummy electrodes DE are also formed so as not to overlap the first to fourth light emitting areas EA1 to EA4.

Code patterns CP are formed at predetermined intervals (e.g., intervals of about 300 μm) in some areas of the front surfaces of the plurality of dummy electrodes DE, the plurality of driving electrodes TE, and the plurality of sensing electrodes RE. In this case, the code patterns CP may be formed by covering not only some areas of the front surfaces of the respective electrodes, but also at least one side surface along with the front surfaces.

The code patterns CP are formed through the same patterning process as the light blocking pattern layers BCP when the light blocking pattern layers BCP are formed of light blocking members made of a material that absorbs light. In this case, the light blocking pattern layers BCP may be further formed in various shapes so as not to come into contact with the code patterns CP in some areas of the front surfaces of the plurality of dummy electrodes DE, the plurality of driving electrodes TE, and the plurality of sensing electrodes RE on which the code patterns CP are not formed.

The planar code shape of the code patterns CP may be formed in a closed loop shape such as a rectangle, a square, a circle, or a rhombus. Alternatively, the planar code shape of the code patterns CP may also be formed in an open loop shape that surrounds only a portion of one light emitting area. In addition, the planar code shape of the code patterns CP may also be formed in a shape of a straight line or a curve having a preset length. When the code patterns CP surrounds both between and around the plurality of light emitting areas instead of one light emitting area, an overall shape of the code patterns CP may also be formed in a mesh structure and a net structure in a plan view. However, an example in which the planar shape of the code patterns CP is formed in a rhombus shape forming a closed loop will be described below.

As described above, the light blocking pattern layers BCP may be further formed in various shapes so as not to come into contact with the code patterns CP in the front surfaces or some areas of the front surfaces of the plurality of dummy electrodes DE, the plurality of driving electrodes TE, and the plurality of sensing electrodes RE on which the code patterns CP are not formed. In order not to appear as a code by the touch input device 20, the light blocking pattern layers BCP may have an extent, a length, an area, and a size that is different from a total extent, an area, a length in at least one direction, and a size of the code patterns CP. For example, the light blocking pattern layers BCP may be formed in a shape of a straight line or a curve having a preset length, or may be formed in an open loop shape that is bent to surround only a portion of at least one light emitting area. In addition, when the light blocking pattern layers BCP surround both between and around the light emitting areas instead of one light emitting area, an overall shape of the light blocking pattern layers BCP may also be formed in a mesh structure and a net structure in a plan view. As described above, as the light blocking pattern layers BCPs that block infrared and ultraviolet light without being recognized as the code shape are formed in some areas of the front surfaces of the touch electrodes SEN and the dummy electrodes DE on which the code patterns CP are not formed, exposed areas of the touch electrodes SEN and the dummy electrodes DE may be reduced. Accordingly, by reducing reflective properties and reflectivity of the touch electrodes SEN and the dummy electrodes DE, a recognition rate and accuracy of the code patterns CP of the touch input device 20 may be increased.

Figure 9:
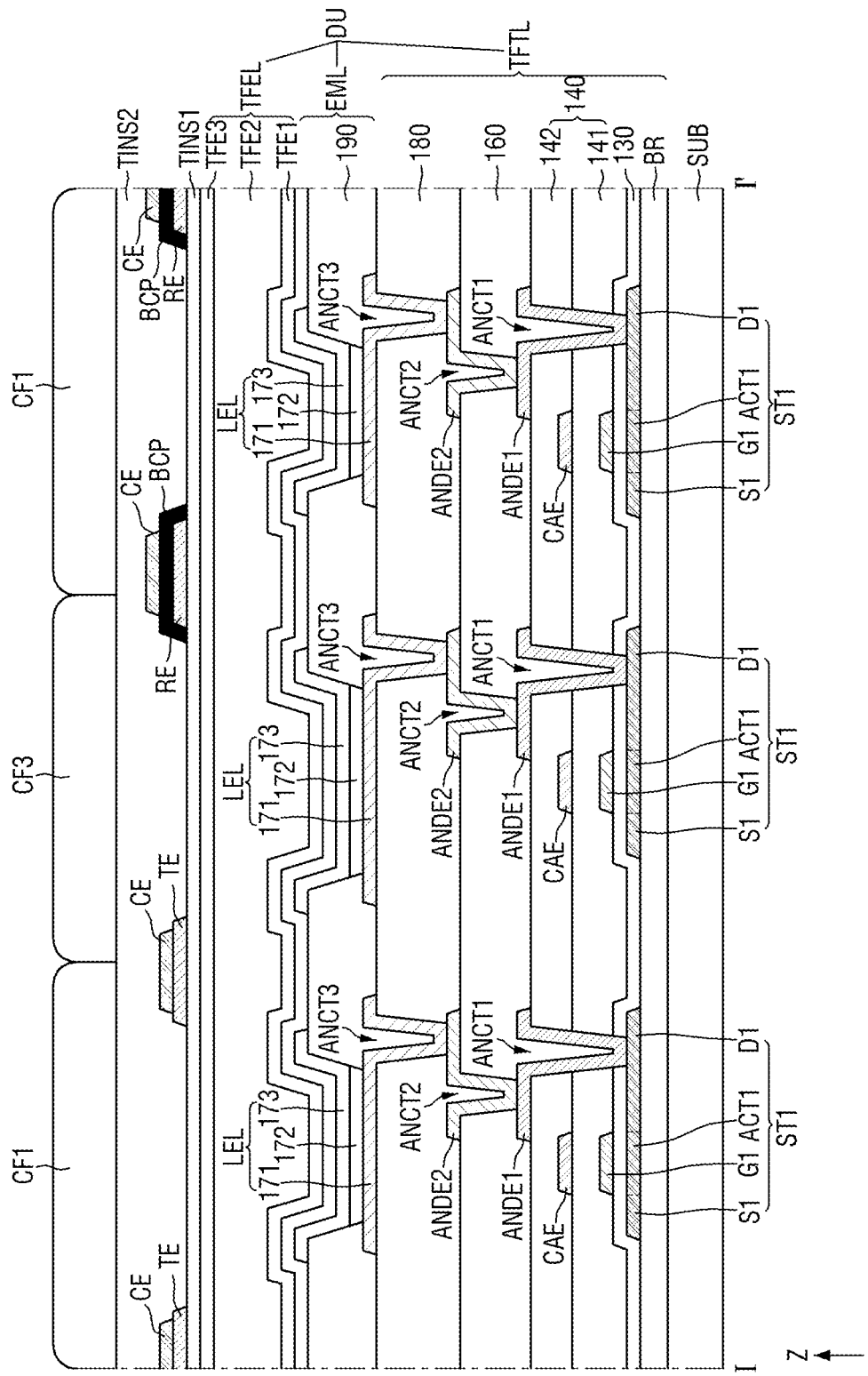
FIG. 9 is a cross-sectional view illustrating a cross-sectional structure taken along line I-I' of FIG. 8.

FIG. 9 is a cross-sectional view illustrating a cross-sectional structure taken along line I-I' of FIG. 8. In addition, FIG. 10 is a cross-sectional view schematically illustrating the cross-sectional structure taken along line I-I' of FIG. 9 in blocks.

Figure 10:
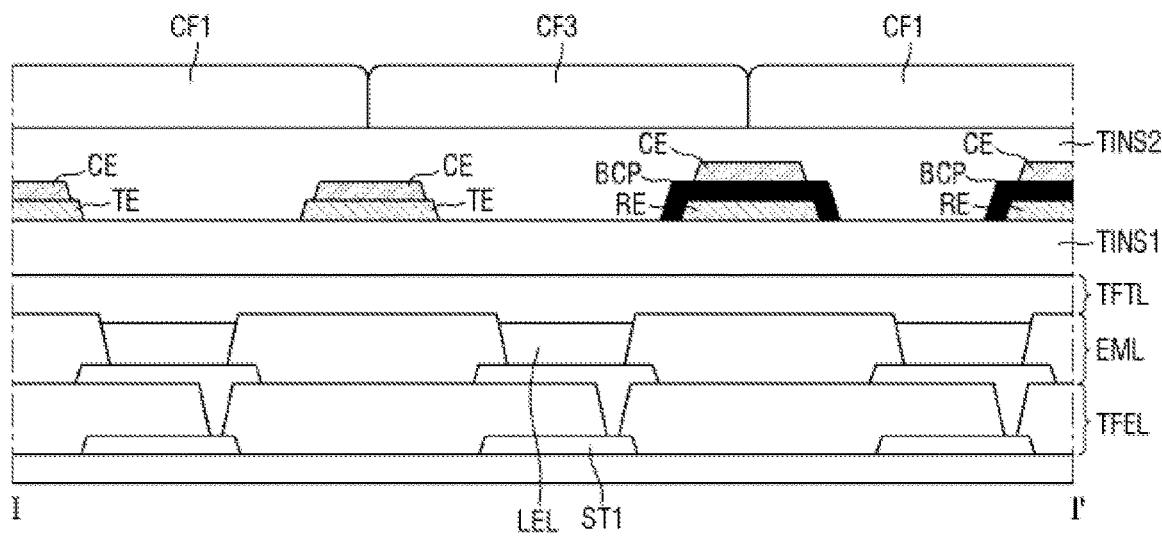
FIG. 10 is a cross-sectional view illustrating the cross-sectional structure taken along line I-I' of FIG. 9 in blocks.

Referring to FIGS. 9 and 10, a barrier layer BR may be disposed on the substrate SUB. The substrate SUB may be made of an insulating material such as a polymer resin. For example, the substrate SUB may be made of polyimide. The substrate SUB may be a flexible substrate that may be bent, folded, rolled, or the like to a noticeable degree without cracking or otherwise sustaining damage.

The barrier layer BR is a layer for protecting the transistors of the thin film transistor layer TFTL and a light emitting layer 172 of the light emitting element layer EML from moisture permeating through the substrate SUB, which is vulnerable to moisture. The barrier layer BR may be made of a plurality of inorganic layers alternately stacked. For example, the barrier layer BR may be formed as multiple layers in which one or more inorganic layers of a silicon nitride layer, a silicon oxynitride layer, a silicon oxide layer, a titanium oxide layer, and an aluminum oxide layer are alternately stacked.

Thin film transistors ST1 may be disposed on the barrier layer BR. Each of the thin film transistors ST1 includes an active layer ACT1, a gate electrode G1, a source electrode S1, and a drain electrode D1.

The active layer ACT1, the source electrode S1, and the drain electrode D1 of each of the thin film transistors ST1 may be disposed on the barrier layer BR. The active layer ACT1 of the thin film transistor ST1 includes polycrystalline silicon, single crystal silicon, low-temperature polycrystalline silicon, amorphous silicon, or an oxide semiconductor. The active layer ACT1 overlapping the gate electrode G1 in the third direction (Z-axis direction), which is the thickness direction of the substrate SUB, may be defined as a channel area. The source electrode S1 and the drain electrode D1 are areas that do not overlap the gate electrode G1 in the third direction (Z-axis direction), and may have conductivity by doping a silicon semiconductor or an oxide semiconductor with ions or impurities.

A gate insulating layer 130 may be disposed on the active layer ACT1, the source electrode S1, and the drain electrode D1 of the thin film transistor ST1. The gate insulating layer 130 may be formed of an inorganic layer, for example, a silicon nitride layer, a silicon oxynitride layer, a silicon oxide layer, a titanium oxide layer, or an aluminum oxide layer.

The gate electrode G1 of the thin film transistor ST1 may be disposed on the gate insulating layer 130. The gate electrode G1 may overlap the active layer ACT1 in the third direction (Z-axis direction). The gate electrode G1 may be formed as a single layer or multiple layers made of any one of molybdenum (Mo), aluminum (Al), chromium (Cr), gold (Au), titanium (Ti), nickel (Ni), neodymium (Nd), and copper (Cu), or alloys thereof.

A first interlayer insulating layer 141 may be disposed on the gate electrode G1 of the thin film transistor ST1. The first interlayer insulating layer 141 may be formed of an inorganic layer, for example, a silicon nitride layer, a silicon oxynitride layer, a silicon oxide layer, a titanium oxide layer, or an aluminum oxide layer. The first interlayer insulating layer 141 may be formed of a plurality of inorganic layers.

A capacitor electrode CAE may be disposed on the first interlayer insulating layer 141. The capacitor electrode CAE may overlap the gate electrode G1 of the first thin film transistor ST1 in the third direction (Z-axis direction). Since the first interlayer insulating layer 141 has a predetermined dielectric constant, a capacitor may be formed by the capacitor electrode CAE, the gate electrode G1, and the first interlayer insulating layer 141 disposed between the capacitor electrode CAE and the gate electrode G1. The capacitor electrode CAE may be formed as a single layer or multiple layers made of any one of molybdenum (Mo), aluminum (Al), chromium (Cr), gold (Au), titanium (Ti), nickel (Ni), neodymium (Nd), and copper (Cu), or alloys thereof.

A second interlayer insulating layer 142 may be disposed on the capacitor electrode CAE. The second interlayer insulating layer 142 may be formed of an inorganic layer, for example, a silicon nitride layer, a silicon oxynitride layer, a silicon oxide layer, a titanium oxide layer, or an aluminum oxide layer. The second interlayer insulating layer 142 may be formed of a plurality of inorganic layers.

A first anode connection electrode ANDE1 may be disposed on the second interlayer insulating layer 142. The first anode connection electrode ANDE1 may be electrically connected to the drain electrode D1 of the thin film transistor ST1 through a first connection contact hole ANCT1 penetrating through the gate insulating layer 130, the first interlayer insulating layer 141, and the second interlayer insulating layer 142. The first anode connection electrode ANDE1 may be formed as a single layer or multiple layers made of any one of molybdenum (Mo), aluminum (Al), chromium (Cr), gold (Au), titanium (Ti), nickel (Ni), neodymium (Nd), and copper (Cu), or alloys thereof.

A first planarization layer 160 for planarizing a step caused by the thin film transistor ST1 may be disposed on the first anode connection electrode ANDE1. The first planarization layer 160 may be formed of an organic layer made of an acryl resin, an epoxy resin, a phenolic resin, a polyamide resin, a polyimide resin, or the like.

A second anode connection electrode ANDE2 may be disposed on the first planarization layer 160. The second anode connection electrode ANDE2 may be electrically connected to the first anode connection electrode ANDE1 through a second connection contact hole ANCT2 penetrating through the first planarization layer 160. The second anode connection electrode ANDE2 may be formed as a single layer or multiple layers made of any one of molybdenum (Mo), aluminum (Al), chromium (Cr), gold (Au), titanium (Ti), nickel (Ni), neodymium (Nd), and copper (Cu), or alloys thereof.

A second planarization layer 180 may be disposed on the second anode connection electrode ANDE2. The second planarization layer 180 may be formed of an organic layer made of an acryl resin, an epoxy resin, a phenolic resin, a polyamide resin, a polyimide resin, or the like.

Light emitting elements LEL and a bank 190 may be disposed on the second planarization layer 180. Each of the light emitting elements LEL includes a pixel electrode 171, a light emitting layer 172, and a common electrode 173.

The pixel electrode 171 may be disposed on the second planarization layer 180. The pixel electrode 171 may be electrically connected to the second anode connection electrode ANDE2 through a third connection contact hole ANCT3 penetrating through the second planarization layer 180.

In a top emission structure that emits light in a direction of the common electrode 173 with respect to the light emitting layer 172, the pixel electrode 171 may be formed of a metal material having high reflectivity, such as a stacked structure (Ti/Al/Ti) of aluminum and titanium, a stacked structure (ITO/Al/ITO) of aluminum and indium tin oxide (ITO), an APC alloy, and a stacked structure (ITO/APC/ITO) of an APC alloy and ITO. The APC alloy is an alloy of silver (Ag), palladium (Pd), and copper (Cu). As used herein, a metal having a high reflectivity may be any metal having a reflectivity that is equal to or greater than that of any of the metals listed above as examples of metals having high reflectivity.

The bank 190 may partition the pixel electrode 171 on the second planarization layer 180 to define the first to third light emitting areas EA1 to EA3. The bank 190 may cover an edge of the pixel electrode 171. The bank 190 may be formed of an organic layer such as an acrylic resin, an epoxy resin, a phenolic resin, a polyamide resin, or a polyimide resin.

Each of the first to third light emitting areas EA1 to EA3 refers to an area in which the pixel electrode 171, the light emitting layer 172, and the common electrode 173 are sequentially stacked and holes from the pixel electrode 171 and electrons from the common electrode 173 are combined with each other in the light emitting layer 172 to emit light.

The light emitting layer 172 may be disposed on the pixel electrode 171 and the bank 190. The light emitting layer 172 may include an organic material to emit light of a predetermined color. For example, the light emitting layer 172 may include a hole transporting layer, an organic material layer, and an electron transporting layer.

The common electrode 173 may be disposed on the light emitting layer 172. The common electrode 173 may cover the light emitting layer 172. The common electrode 173 may be a common layer commonly formed in the first light emitting area EA1, the second light emitting area EA2, and the third light emitting area EA3. A capping layer may be formed on the common electrode 173.

In the top emission structure, the common electrode 173 may be formed of a transparent conductive material (TCO) such as ITO or indium zinc oxide (IZO) capable of transmitting light therethrough, or a semi-transmissive conductive material such as magnesium (Mg), silver (Ag), or an alloy of magnesium (Mg) and silver (Ag). When the common electrode 173 is formed of the semi-transmissive conductive material, emission efficiency may be increased by a micro cavity.

An encapsulation layer TFEL may be disposed on the common electrode 173. The encapsulation layer TFEL may include at least one inorganic layer to prevent oxygen or moisture from permeating into the light emitting element layer EML. In addition, the encapsulation layer TFEL may include at least one organic layer to protect the light emitting element layer EML from foreign materials such as dust. For example, the encapsulation layer TFEL includes a first encapsulation inorganic layer TFE1, an encapsulation organic layer TFE2, and a second encapsulation inorganic layer TFE3.

The first encapsulation inorganic layer TFE1 may be disposed on the common electrode 173, the encapsulation organic layer TFE2 may be disposed on the first encapsulation inorganic layer TFE1, and the second encapsulation inorganic layer TFE3 may be disposed on the encapsulation organic layer TFE2. The first encapsulation inorganic layer TFE1 and the second encapsulation inorganic layer TFE3 may be formed as multiple layers in which one or more inorganic layers of a silicon nitride layer, a silicon oxynitride layer, a silicon oxide layer, a titanium oxide layer, and an aluminum oxide layer are alternately stacked. The encapsulation organic layer TFE2 may be an organic layer such as an acrylic resin, an epoxy resin, a phenolic resin, a polyamide resin, or a polyimide resin.

A touch sensing unit TSU may be disposed on the encapsulation layer TFEL. The touch sensing unit TSU includes a first touch insulating layer TINS1, driving electrodes TE, sensing electrodes RE, light blocking pattern layer BCP, connection electrodes CE, a code pattern CP, and a second touch insulating layer TINS2.

The first touch insulating layer TINS1 may be formed as an inorganic layer, for example, a silicon nitride layer, a silicon oxynitride layer, a silicon oxide layer, a titanium oxide layer, or an aluminum oxide layer.

The driving electrodes TE and the sensing electrodes RE may be disposed on the first touch insulating layer TINS1. In addition, in addition to the driving electrodes TE and the sensing electrodes RE, the dummy electrodes DE, the first touch driving lines TL1, the second touch driving lines TL2, and the touch sensing lines RL illustrated in FIG. 4 may be disposed on the second touch insulating layer TINS2.

The driving electrodes TE, the sensing electrodes RE, and the dummy electrodes DE are formed as a conductive metal electrode, and the conductive metal electrode may be formed of any one of molybdenum (Mo), aluminum (Al), chromium (Cr), gold (Au), titanium (Ti), nickel (Ni), neodymium (Nd), and copper (Cu), or alloys thereof. The driving electrodes TE, the sensing electrodes RE, and the dummy electrodes DE are formed in a mesh structure or a net structure so as not to overlap the light emitting areas EA1 to EA4. Each of the driving electrode TE and the sensing electrode RE may partially overlap the connection electrode CE in the third direction (Z-axis direction).

As a light blocking member is coated and patterned on the front surfaces of the driving electrodes TE, the sensing electrodes RE, and the dummy electrodes DE, light blocking pattern layers BCP and code patterns CP are formed on some surfaces of the driving electrodes TE, the sensing electrodes RE, and the dummy electrodes DE.

The light blocking pattern layers BCP may be respectively formed to partially overlap the sensing electrodes RE in the formation areas of the connection electrodes CE connecting the driving electrodes TE adjacent to each other. For example, the light blocking pattern layers BCP may be respectively formed to partially overlap the sensing electrodes RE in intersection areas where the driving electrodes TE in the Y-axis direction and the sensing electrodes RE in the X-axis direction intersect. In addition, the code patterns CP are formed in some areas of the front surfaces of the driving electrodes TE, the sensing electrodes RE, and the dummy electrodes DE.

The light blocking member constituting the code patterns CP and the light blocking pattern layers BCP may be formed of materials including an infrared or ultraviolet absorbing material. For example, the light blocking member may be formed of a material including an inorganic or organic black pigment. Here, the inorganic black pigment may be a pigment including at least one compound of carbon black, cyanine, polymethine, anthraquinone, and phthalocyanine-based compounds. The organic black pigment may include lactam black, perylene black, and/or aniline black, but is not necessarily limited thereto.

A plurality of connection electrodes CE are respectively patterned and formed on the light blocking pattern layers BCP in the areas where the driving electrodes TE and the sensing electrodes RE intersect. For example, the connection electrodes CE may be formed on an upper layer (or a front layer) of the layer on which the driving electrodes TE and the sensing electrodes RE are formed with the light blocking pattern layers BCP interposed therebetween, and may be electrically connected to the exposed areas mCT in a front direction of the driving electrodes TE in which the light blocking pattern layer BCP is not formed and the front surface thereof is exposed. The connection electrodes CE may be formed as a single layer or multiple layers made of any one of molybdenum (Mo), aluminum (Al), chromium (Cr), gold (Au), titanium (Ti), nickel (Ni), neodymium (Nd), and copper (Cu), or alloys thereof.

A second touch insulating layer TINS2 is formed on the connection electrodes CE on the light blocking pattern layers BCP and each of the driving electrodes TE including the code patterns CP. The second touch insulating layer TINS2 may serve to planarize a step formed by the driving electrodes TE, the sensing electrodes RE, and the connection electrodes CE. To this end, the second touch insulating layer TINS2 may be formed of an inorganic layer, for example, a silicon nitride layer, a silicon oxynitride layer, a silicon oxide layer, a titanium oxide layer, or an aluminum oxide layer. Alternatively, the second touch insulating layer TINS2 may be formed as an organic layer made of an acryl resin, an epoxy resin, a phenolic resin, a polyamide resin, a polyimide resin, or the like.

As described above, the driving electrodes TE, the sensing electrodes RE, and the dummy electrodes DE may be disposed on the first touch insulating layer TINS1, and the light blocking pattern layers BCP may be formed at the intersection areas between the driving electrodes TE and the sensing electrodes RE. In addition, the connection electrodes CE may be disposed on the light blocking pattern layers BCP to electrically connect the touch electrodes SEN with the light blocking pattern layers BCP interposed therebetween. Accordingly, the processes of forming the touch insulating layer and the contact holes to connect the driving electrodes TE and the connection electrodes CE in different layers may be omitted, and the driving electrodes TE and the connection electrodes CE may be electrically connected in different layers using the light blocking pattern layers BCP. When the light blocking pattern layer BCP is formed, a plurality of code patterns CP may be formed. Therefore, only the first and second touch insulating layers TINS1 and TINS2 may be formed on the touch sensing unit TSU without an additional process of forming the touch insulating layer or the contact hole.

A plurality of color filter layers CFL1 and CFL3 may be formed on the touch sensing unit TSU. For example, the plurality of color filter layers CFL1 and CFL3 may be disposed and formed on the third touch insulating layer TINS3 in a planar shape.

Each of the color filter layers may be formed on the third touch insulating layer TINS3 to overlap the first to fourth light emitting areas EA1 to EA4, respectively, but may also be formed on the second touch insulating layer TINS2 including the driving electrodes TE and the sensing electrodes RE to overlap the first to fourth light emitting areas EA1 to EA4, respectively. Here, a first color filter CFL1 may be disposed on the first light emitting area EA1 emitting the light of the first color, a second color filter may be disposed on the second light emitting area EA2 emitting the light of the second color, and a third color filter CFL3 may be disposed on the third light emitting area EA3 emitting the light of the third color. In addition, the second color filter may also be disposed on the fourth light emitting area emitting the light of the second color.

Figure 11:
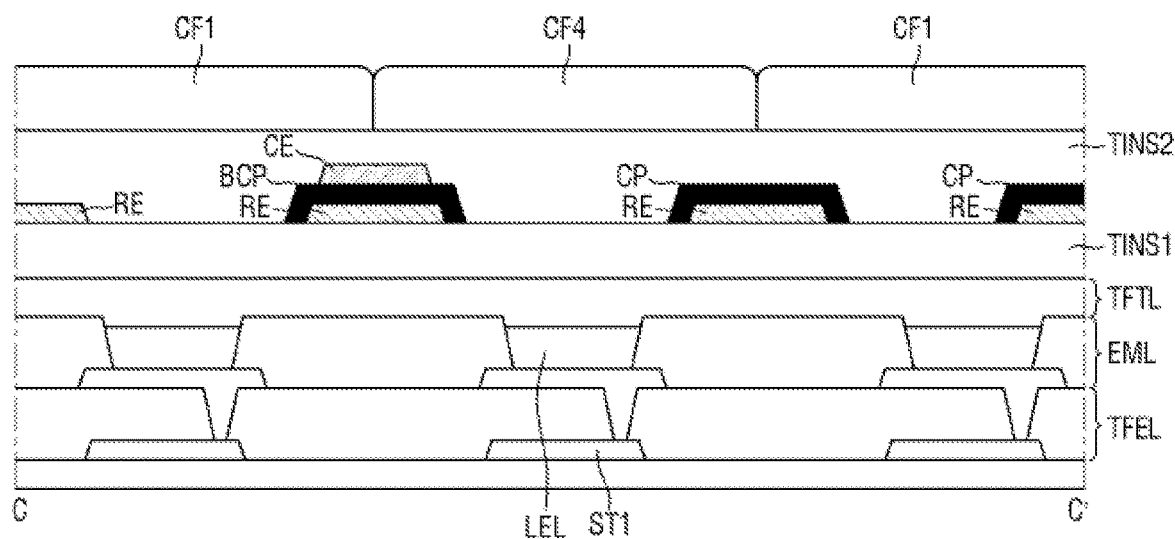
FIG. 11 is a cross-sectional view illustrating a cross-sectional structure taken along line C-C' of FIGS. 7 and 8.

FIG. 11 is a cross-sectional view illustrating a cross-sectional structure taken along line C-C' of FIGS. 7 and 8.

Referring to FIG. 11, the driving electrodes TE, the sensing electrodes RE, and the dummy electrodes DE may be disposed on the first touch insulating layer TINS1, and the light blocking pattern layers BCP may be formed at the intersection areas between the driving electrodes TE and the sensing electrodes RE. Accordingly, the light blocking pattern layers BCP may be formed on the sensing electrodes RE intersecting the driving electrodes TE.

When the light blocking pattern layers BCP are formed, the code patterns CP are simultaneously formed of the same material as the light blocking pattern layers BCP through the same patterning process on some surfaces of the driving electrodes TE, the sensing electrodes RE, and the dummy electrodes DE. The planar code shape of the code patterns CP is formed in a closed loop shape or a mesh shape preset to be detected as a code shape by the touch input device 20. For example, the code patterns CP may be formed at preset intervals of about 300 μm on the front surfaces of the driving electrodes TE and the sensing electrodes RE as well as the dummy electrodes DE. The width, size, and length of the code patterns CP in at least one direction may be set and formed to correspond to the size, sensing area, arrangement, and the like of each light receiving unit 21(b) or each optical image sensor included in the code detection unit 21 of the touch input device 20. Accordingly, the code detection unit 21 of the touch input device 20 may sense only the code shape of the code patterns CP formed with a preset width, size, and length.

The connection electrodes CE are formed on the light blocking pattern layers BCP, and are electrically connected to the exposed areas mCT in the front direction of the driving electrodes TE in which the light blocking pattern layer BCP is not formed and the front surface thereof is exposed. Next, a second touch insulating layer TINS2 is formed on the connection electrodes CE on the light blocking pattern layers BCP and each of the driving electrodes TE including the code patterns CP. In addition, a plurality of color filter layers CFL1 and CFL3 are formed on the touch sensing unit TSU.

Figure 12:
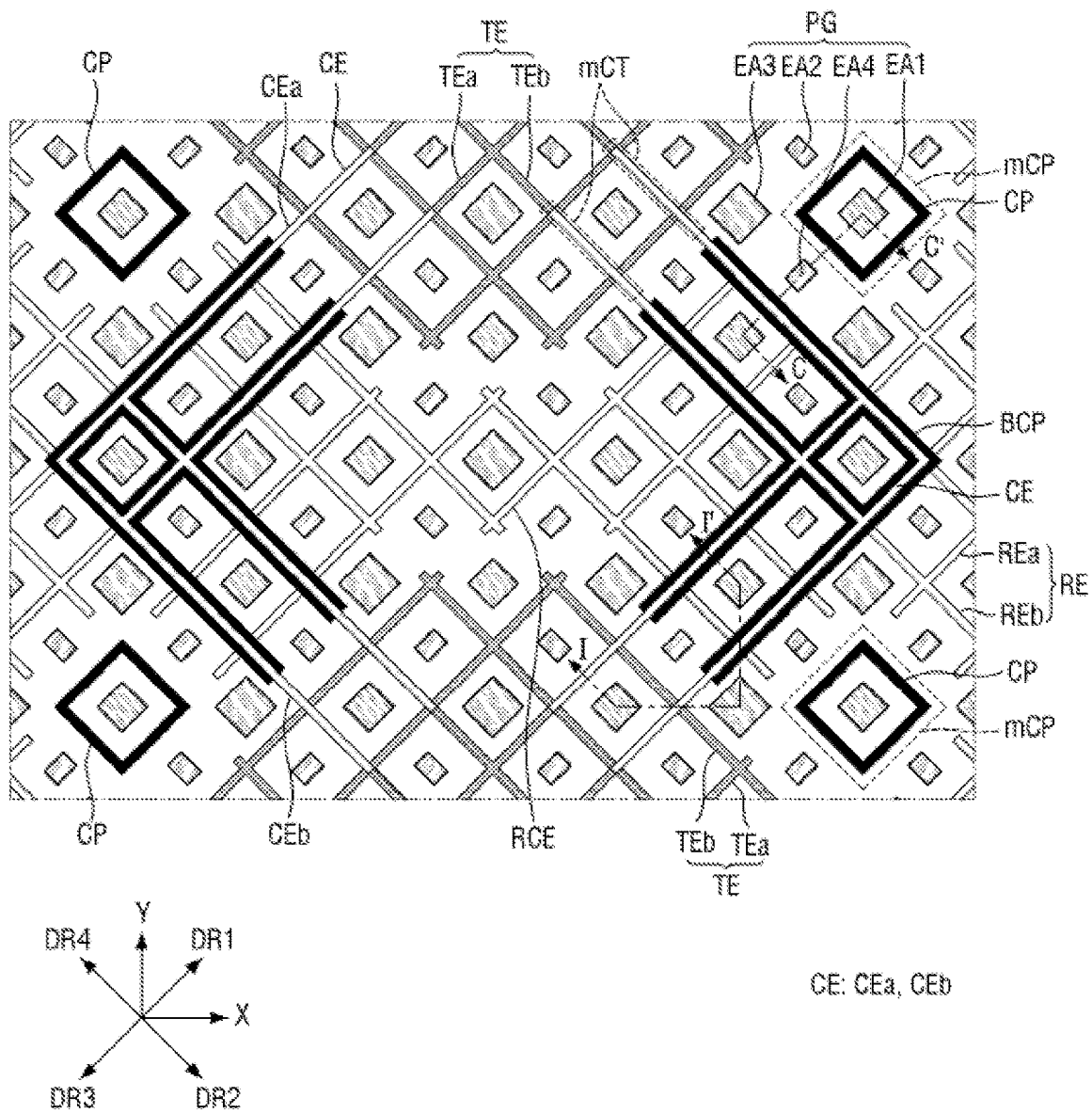
FIG. 12 is an enlarged view illustrating an area A1 in which code patterns are disposed according to an embodiment.

FIG. 12 is an enlarged view illustrating an area A1 in which code patterns are disposed according to an embodiment.

Referring to FIG. 12, the driving electrodes TE, the sensing electrodes RE, and the dummy electrodes DE may be formed in a shape in which some electrodes thereof are cut to form the code areas mCP in which the electrodes are not formed in a planar shape. Accordingly, the code areas mCP in which the driving electrodes TE, the sensing electrodes RE, and the dummy electrodes DE are not formed are provided on the first touch insulating layer TINS1.

The light blocking pattern layers BCP are formed at the intersection areas of the driving electrodes TE and the sensing electrodes RE to cover the intersection areas, respectively. When the light blocking pattern layers BCP are formed, the light blocking pattern layers BCP may be further formed on the front surfaces or some of the front surfaces of the remaining driving electrodes TE, sensing electrodes RE, and dummy electrodes DE other than the intersection areas of the driving electrodes TE and the sensing electrodes RE. For example, the light blocking pattern layers BCP may be formed in various pattern shapes on the front surfaces or some of the front surfaces of the plurality of touch electrodes SEN and the plurality of dummy electrodes DE in addition to the areas overlapping the connection electrodes CE to insulate the connection electrodes CE.

In addition, when the light blocking pattern layers BCP are formed, the code patterns CP having a position code shape may be respectively formed in the code areas mCP in which the driving electrodes TE, the sensing electrodes RE, and the dummy electrodes DE are not formed.

Figure 13:
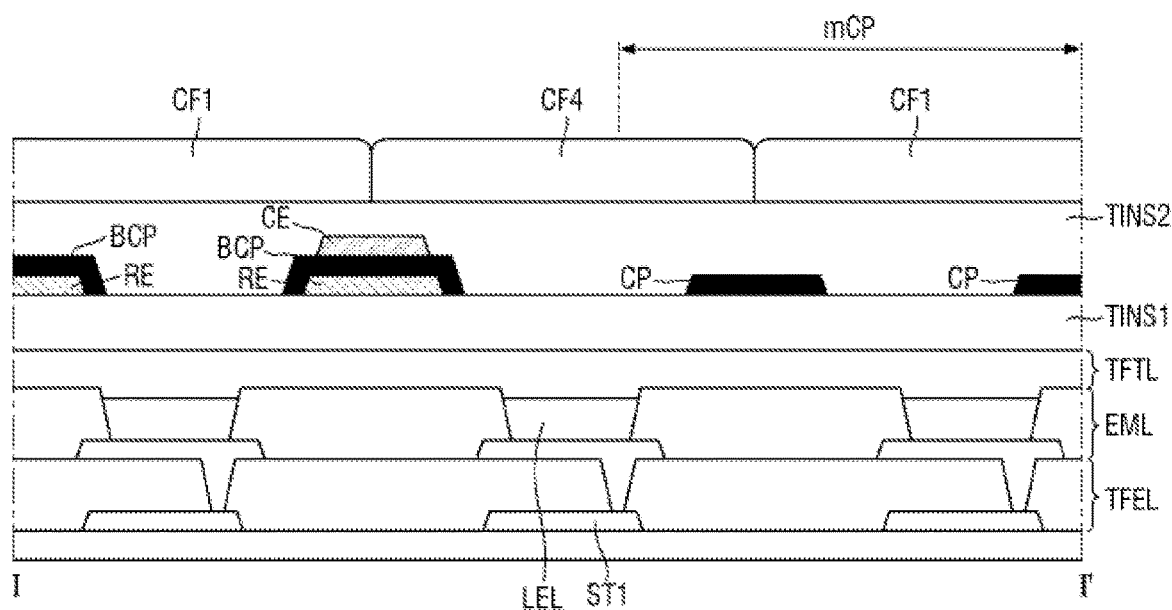
FIG. 13 is a cross-sectional view illustrating a cross-sectional structure taken along line C-C' of FIG. 12.

FIG. 13 is a cross-sectional view illustrating a cross-sectional structure taken along line C-C' of FIG. 12.

Referring to FIG. 13, the driving electrodes TE, the sensing electrodes RE, and the dummy electrodes DE may be patterned and disposed on the first touch insulating layer TINS1, and the driving electrodes TE, the sensing electrodes RE, and the dummy electrodes DE form the code areas mCP in which the electrodes are not formed in a shape in which some electrodes thereof are cut.

The light blocking pattern layers BCP are formed on some of the front surfaces of the driving electrodes TE, the sensing electrodes RE, and the dummy electrodes DE, and when the light blocking pattern layers BCP are formed, the code patterns CP are formed in the code areas mCP in which the driving electrodes TE, the sensing electrodes RE, and the dummy electrodes DE are formed in the cut shape.

The light blocking pattern layers BCP cover the front surfaces of the driving electrodes TE, the sensing electrodes RE, and the dummy electrodes DE, respectively, and the code patterns CP may be respectively formed on the first touch insulating layer TINS1 of the code areas mCP.

The width, size, and length of the code patterns CP in at least one direction may be set and formed to correspond to the size, sensing area, arrangement, and the like of each light receiving unit 21(b) or each optical image sensor included in the code detection unit 21 of the touch input device 20. Accordingly, the code detection unit 21 of the touch input device 20 may sense only the code shape of the code patterns CP formed with a preset width, size, and length.

The code detection unit 21 of the touch input device 20 may sense engraved-type dark code patterns CP having low infrared reflectivity. However, the light blocking pattern layers BCP covering the driving electrodes TE, the sensing electrodes RE, and the dummy electrodes DE, respectively, may have higher reflectivity than the code patterns CP due to the reflectivity of each electrode. Therefore, since the reflectivity of the code patterns CP respectively formed in the code areas mCP is lower than that of the light blocking pattern layers BCP and an infrared absorption rate thereof is higher than that of the light blocking pattern layers BCP, a recognition rate of the engraved-type dark code patterns CP may be higher.

Figure 14:
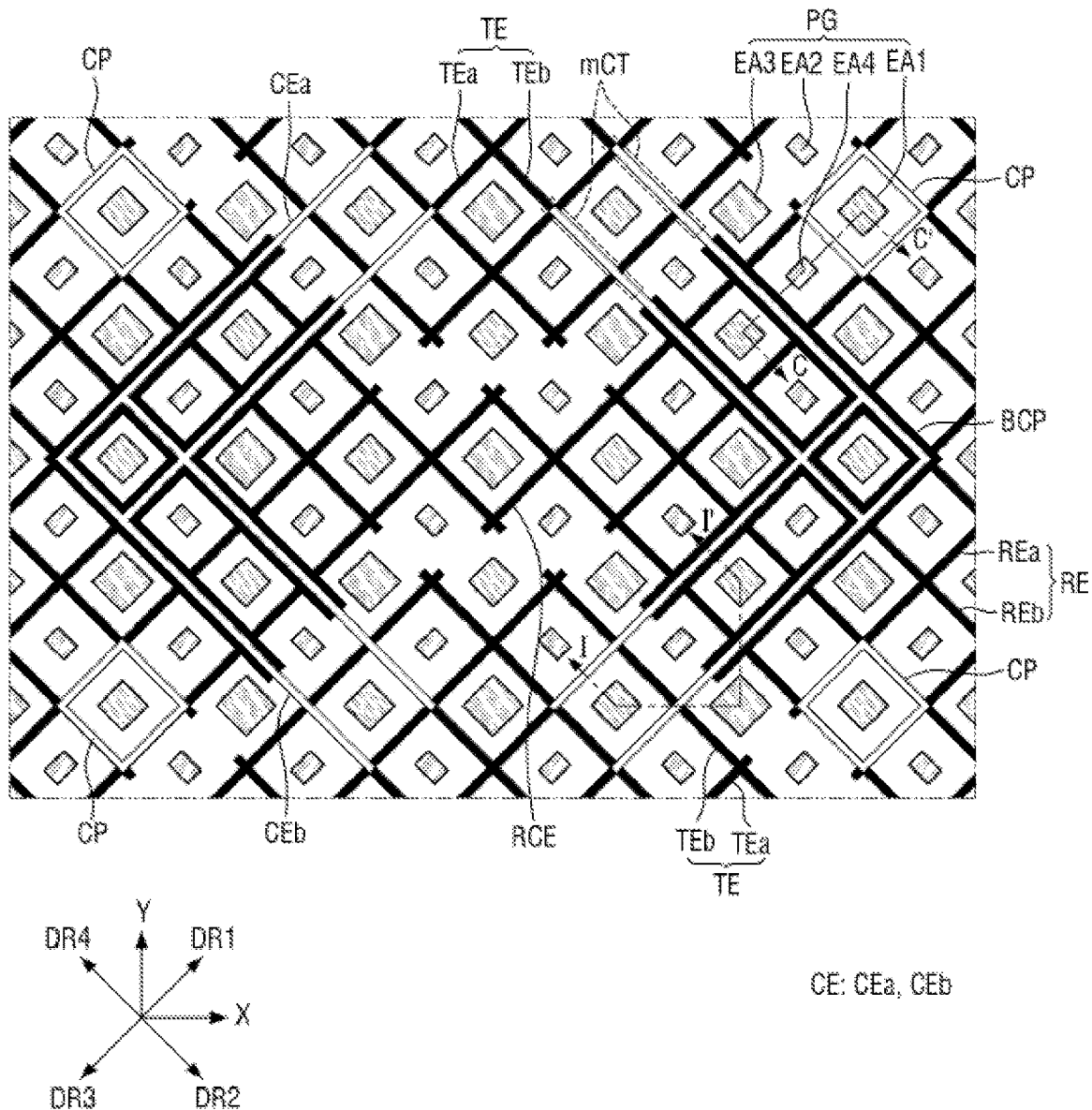
FIG. 14 is an enlarged view illustrating an area A1 in which code patterns are disposed according to an embodiment.

FIG. 14 is an enlarged view illustrating an area A1 in which code patterns are disposed according to an embodiment.

Referring to FIG. 14, the plurality of driving electrodes TE, the plurality of sensing electrodes RE, and the plurality of dummy electrodes DE may be disposed on the same layer and may be spaced apart from each other.

The driving electrodes TE adjacent to each other in the Y-axis direction may be electrically connected to each other through the connection electrodes CE formed on the front surfaces thereof with the light blocking pattern layer BCP interposed therebetween. The connection electrodes CE are electrically connected to the exposed areas mCT in the front direction of the driving electrodes TE in which the light blocking pattern layer BCP is not formed and the front surface thereof is exposed.

The light blocking pattern layer BCP may be formed on the front surfaces of the plurality of dummy electrodes DE, the plurality of driving electrodes TE, and the plurality of sensing electrodes RE on which the code patterns CP are not formed. For example, the code patterns CP may be formed in an embossed type having high reflectivity by exposing the front surfaces of the plurality of dummy electrodes DE, the plurality of driving electrodes TE, and the plurality of sensing electrodes RE in a preset planar code shape. In addition, the light blocking pattern layer BCP may be formed by covering the front surfaces of the plurality of dummy electrodes DE, the plurality of driving electrodes TE, and the plurality of sensing electrodes RE except for the formation areas (or positions) of the preset code patterns CP and the shape of the code patterns CP.

The code detection unit 21 of the touch input device 20 may detect embossed type code patterns CP having high infrared reflectivity. Accordingly, the embossed type code patterns CP having high reflectivity by exposing the front surfaces of the plurality of dummy electrodes DE, the plurality of driving electrodes TE, and the plurality of sensing electrodes RE may have increased sensing and recognition rates.

Figure 15:
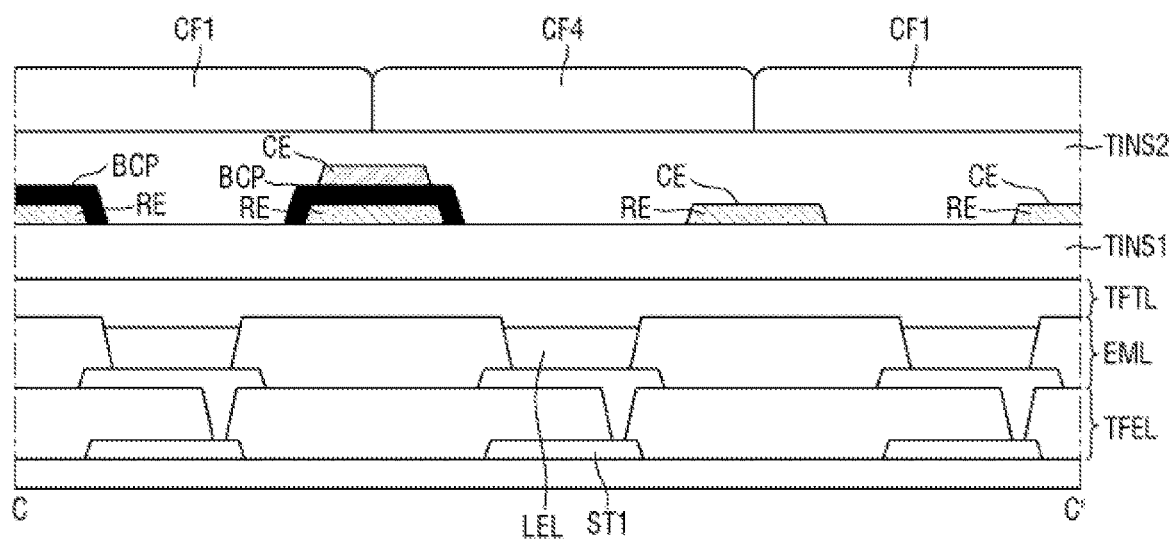
FIG. 15 is a cross-sectional view illustrating a cross-sectional structure taken along line C-C' of FIG. 14.

FIG. 15 is a cross-sectional view illustrating a cross-sectional structure taken along line C-C' of FIG. 14.

Referring to FIG. 15, the driving electrodes TE, the sensing electrodes RE, and the dummy electrodes DE may be patterned and disposed on the first touch insulating layer TINS1, and the light blocking pattern layers BCP may be formed on some of the front surfaces of the driving electrodes TE, the sensing electrodes RE, and the dummy electrodes DE.

The light blocking pattern layers BCP are formed by covering the front surfaces of the plurality of dummy electrodes DE, the plurality of driving electrodes TE, and the plurality of sensing electrodes RE except for the preset shapes and formation areas of the code patterns CP. Accordingly, the code patterns CP are formed in an embossed type having high reflectivity by exposing the front surfaces of the plurality of dummy electrodes DE, the plurality of driving electrodes TE, and the plurality of sensing electrodes RE in a preset planar code shape.

The width, size, and length of the embossed type code patterns CP in at least one direction may be set and formed to correspond to the size, sensing area, arrangement, and the like of each light receiving unit 21(b) or each optical image sensor included in the code detection unit 21 of the touch input device 20. Accordingly, the code detection unit 21 of the touch input device 20 may sense the code patterns CP according to the shape of the infrared rays reflected with a preset width, size, and length.

Figure 16:
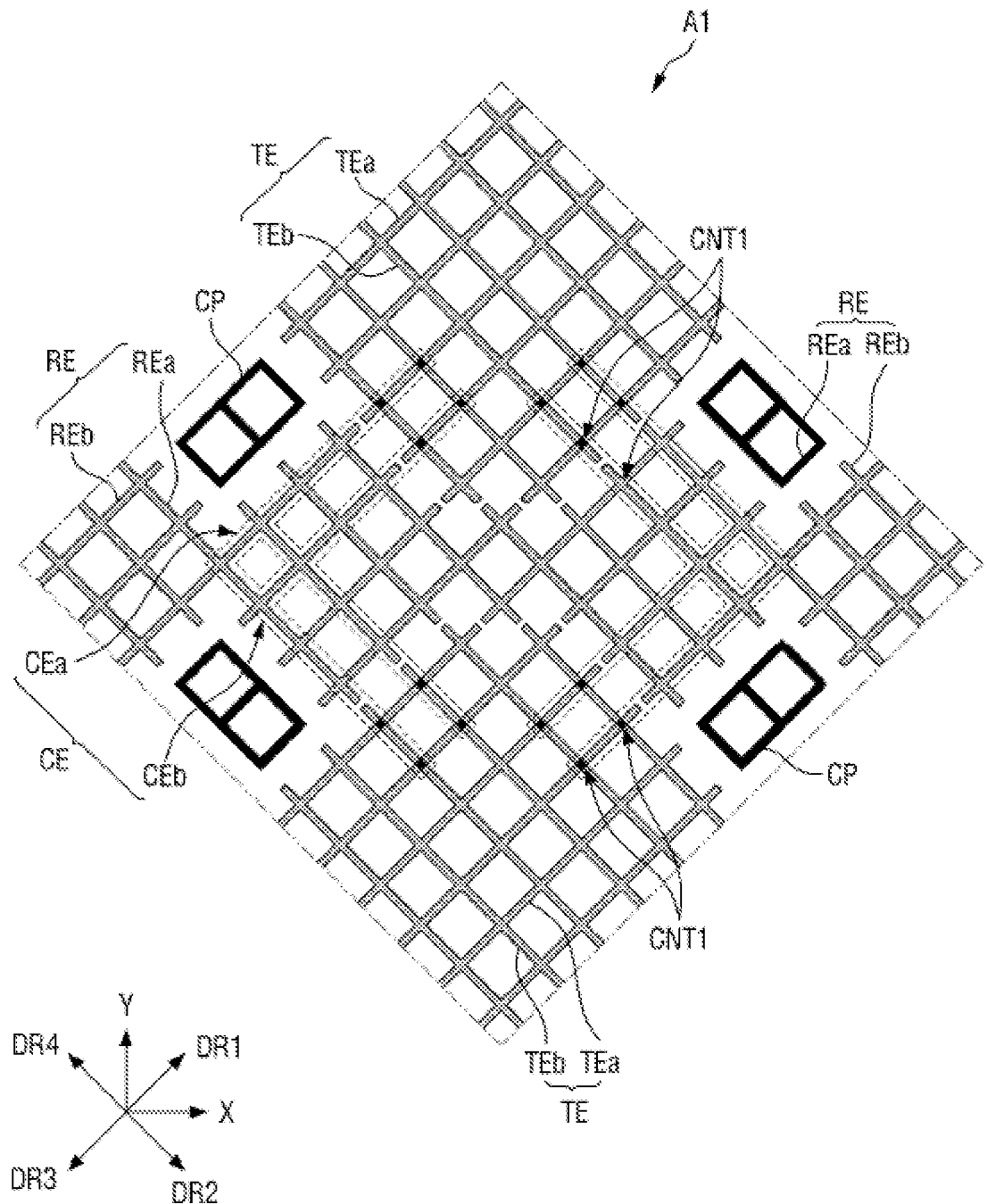
FIG. 16 is an enlarged view of an area A1 in which code patterns are disposed according to an embodiment.
Figure 17:
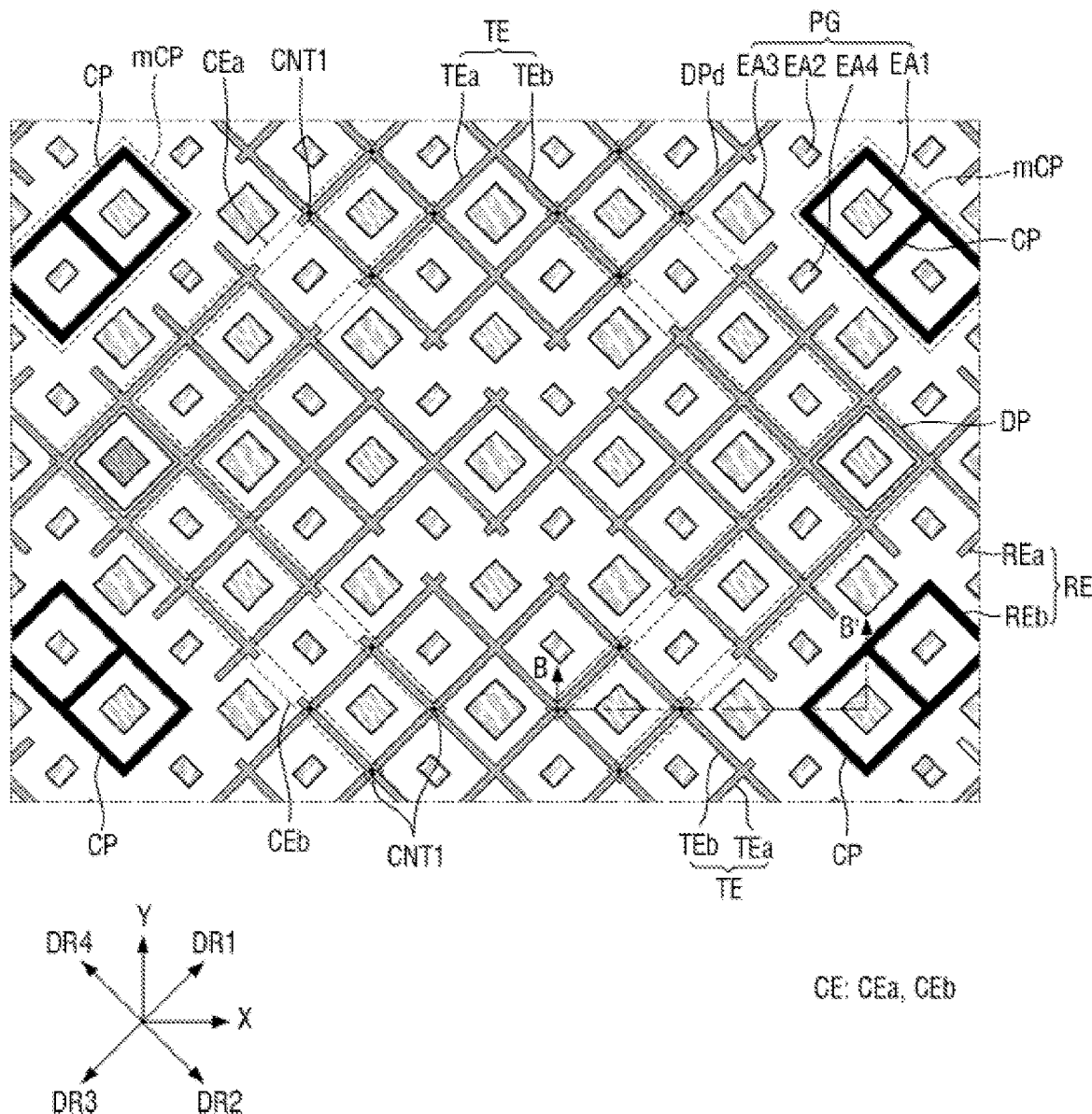
FIG. 17 is an enlarged view illustrating the area A1 of FIG. 16.

FIG. 16 is an enlarged view of an area A1 in which code patterns are disposed according to an embodiment. In addition, FIG. 17 is an enlarged view illustrating the area A1 of FIG. 16.

Referring to 16 and 17, the plurality of driving electrodes TE, the plurality of sensing electrodes RE, and the plurality of dummy electrodes DE may be disposed on the same layer and may be spaced apart from each other.

The plurality of driving electrodes TE may be arranged in the X-axis direction and the Y-axis direction. The plurality of driving electrodes TE may be spaced apart from each other in the X-axis direction and the Y-axis direction. The driving electrodes TE adjacent to each other in the Y-axis direction may be electrically connected to the connection electrode CE on the rear surface through each of the first contact holes CNT1.

The plurality of sensing electrodes RE may extend in the X-axis direction and may be spaced apart from each other in the Y-axis direction. The plurality of sensing electrodes RE may be arranged in the X-axis direction and the Y-axis direction, and the sensing electrodes RE adjacent to each other in the X-axis direction may be electrically connected to each other. For example, the sensing electrodes RE may be electrically connected to each other through a connection portion, and the connection portion may be disposed within the shortest distance between the driving electrodes TE adjacent to each other.

The plurality of connection electrodes CE may be disposed on a layer different from that of the driving electrode TE and the sensing electrode RE, for example, a rear layer. The driving electrodes TE adjacent to each other in the Y-axis direction may be electrically connected to the connection electrode CE formed on the rear surface thereof through the first contact hole CNT1 with the first touch insulating layer TINS1 interposed therebetween.

The connection electrode CE may include a first portion CEa and a second portion CEb. For example, the first portion CEa of the connection electrode CE may be electrically connected to the driving electrode TE disposed on one side through a first contact hole CNT1 to extend in the third direction DR3. The second portion CEb of the connection electrode CE may be bent from the first portion CEa in an area overlapping the sensing electrode RE to extend in the second direction DR2, and may be electrically connected to the driving electrode TE disposed on the other side through the first contact hole CNT1. Hereinafter, the first direction DR1 may refer to a direction between the X-axis direction and the Y-axis direction, the second direction DR2 may refer to a direction between a direction opposite to the Y-axis direction and the X-axis direction, the third direction DR3 may refer to a direction opposite to the first direction DR1, and the fourth direction DR4 may refer to a direction opposite to the second direction DR2. Accordingly, each of the plurality of connection electrodes CE may connect the driving electrodes TE adjacent to each other in the Y-axis direction.

The driving electrodes TE, the sensing electrodes RE, and the dummy electrodes DE may form the code areas mCP in which the electrodes are not formed in a shape in which some electrodes are cut. Accordingly, the code areas mCP in which the driving electrodes TE, the sensing electrodes RE, and the dummy electrodes DE are not formed are provided on the first or second touch insulating layer TINS1 or TINS2. In addition, the code patterns CP having a position code shape may be respectively formed in the code areas mCP in which the driving electrodes TE, the sensing electrodes RE, and the dummy electrodes DE are not formed.

As an example, the light blocking pattern layers BCP may be formed on some of the front surfaces of the driving electrodes TE, the sensing electrodes RE, and the dummy electrodes DE, and when the light blocking pattern layers BCP are formed, the code patterns CP may be formed in the code areas mCP in which the driving electrodes TE, the sensing electrodes RE, and the dummy electrodes DE are formed in the cut shape. The light blocking pattern layers BCP cover the driving electrodes TE, the sensing electrodes RE, and the dummy electrodes DE, respectively, and the code patterns CP may be respectively formed on the first or second touch insulating layer TINS1 or TINS2 of the code areas mCP.

Figure 18:
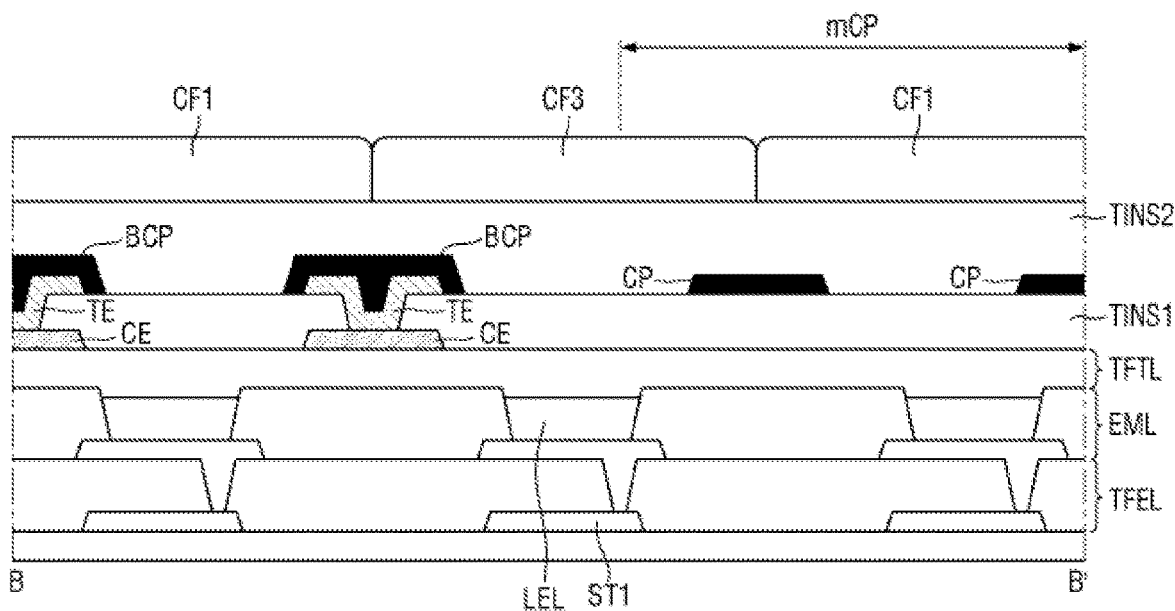
FIG. 18 is a cross-sectional view illustrating a cross-sectional structure taken along line B-B' of FIG. 17.

FIG. 18 is a cross-sectional view illustrating a cross-sectional structure taken along line B-B' of FIG. 17.

Referring to FIG. 18, the driving electrodes TE, the sensing electrodes RE, and the dummy electrodes DE may be patterned and disposed on the first touch insulating layer TINS1, and the driving electrodes TE adjacent in the Y-axis direction may be electrically connected to the connection electrode CE formed on the rear surface thereof with the first touch insulating layer TINS1 interposed therebetween through the first contact hole CNT1.

The driving electrodes TE, the sensing electrodes RE, and the dummy electrodes DE form the code areas mCP in which the electrodes are not formed in a shape in which some electrodes are cut. The light blocking pattern layers BCP are formed on some of the front surfaces of the driving electrodes TE, the sensing electrodes RE, and the dummy electrodes DE, and the code patterns CP are formed in the code areas mCP. In this case, the light blocking pattern layers BCP cover the driving electrodes TE, the sensing electrodes RE, and the dummy electrodes DE, respectively, and the code patterns CP may be respectively formed on the first touch insulating layer TINS1 of the code areas mCP.

Figure 19:
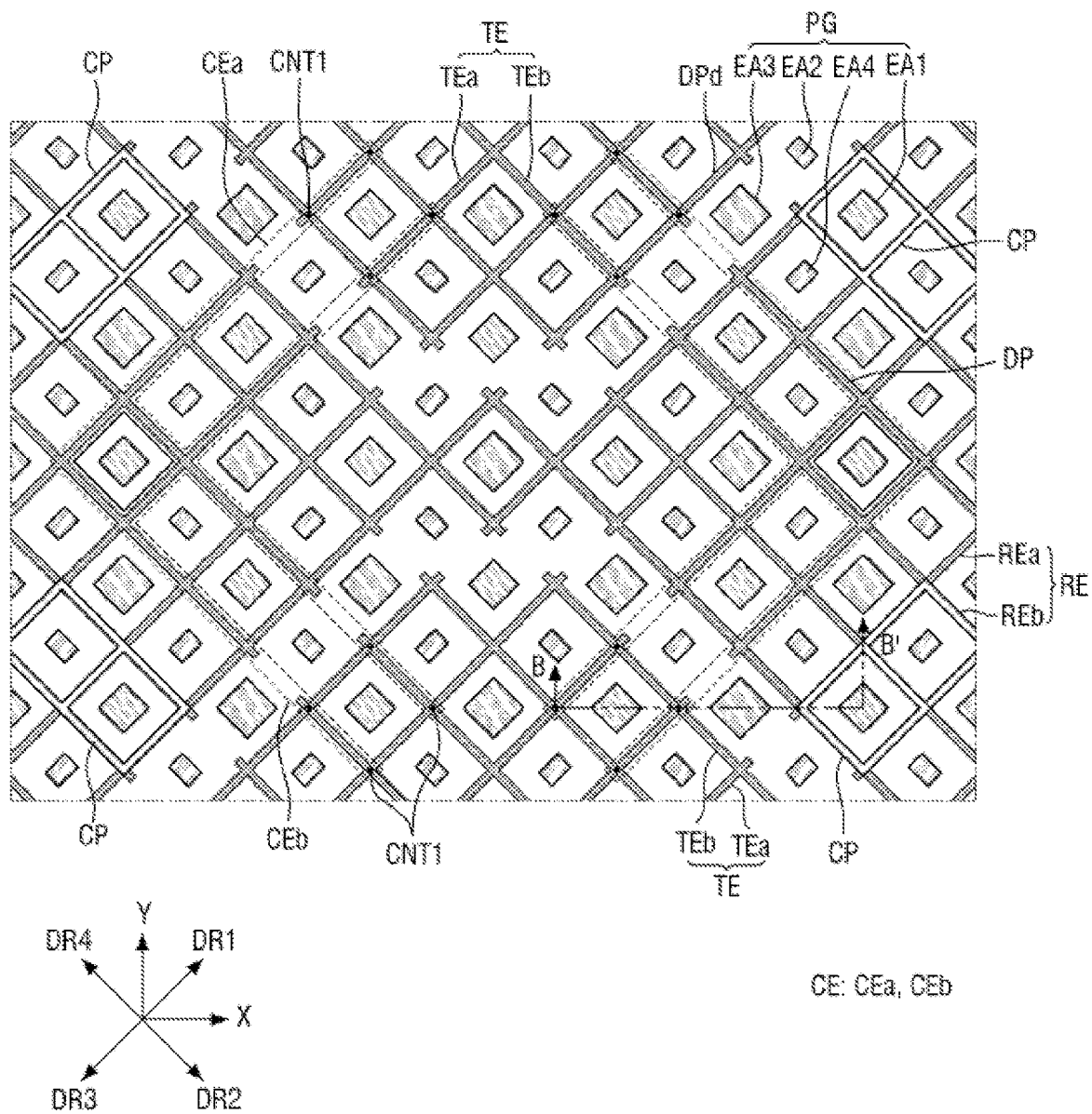
FIG. 19 is an enlarged view illustrating an area A1 in which code patterns are disposed according to an embodiment.

FIG. 19 is an enlarged view illustrating an area A1 in which code patterns are disposed according to an embodiment.

The plurality of driving electrodes TE may be arranged in the X-axis direction and the Y-axis direction. The plurality of driving electrodes TE may be spaced apart from each other in the X-axis direction and the Y-axis direction. The driving electrodes TE adjacent to each other in the Y-axis direction may be electrically connected to the connection electrode CE on the rear surface through each of the first contact holes CNT1.

The light blocking pattern layer BCP may be formed on the front surfaces of the plurality of dummy electrodes DE, the plurality of driving electrodes TE, and the plurality of sensing electrodes RE on which the code patterns CP are not formed. For example, the light blocking pattern layer BCP may be formed by covering the front surfaces of the plurality of dummy electrodes DE, the plurality of driving electrodes TE, and the plurality of sensing electrodes RE except for the preset shapes of the code patterns CP. Accordingly, the code patterns CP may be formed in an embossed type having high reflectivity by exposing front surfaces of the plurality of dummy electrodes DE, the plurality of driving electrodes TE, and the plurality of sensing electrodes RE in a preset planar code shape.

Since the touch input device 20 may sense the embossed type code patterns CP having high infrared reflectivity, the embossed type code patterns CP having high reflectivity by exposing the front surfaces of the dummy electrodes DE, the driving electrodes TE, and the sensing electrodes RE may have increased sensing and recognition rates.

Figure 20:
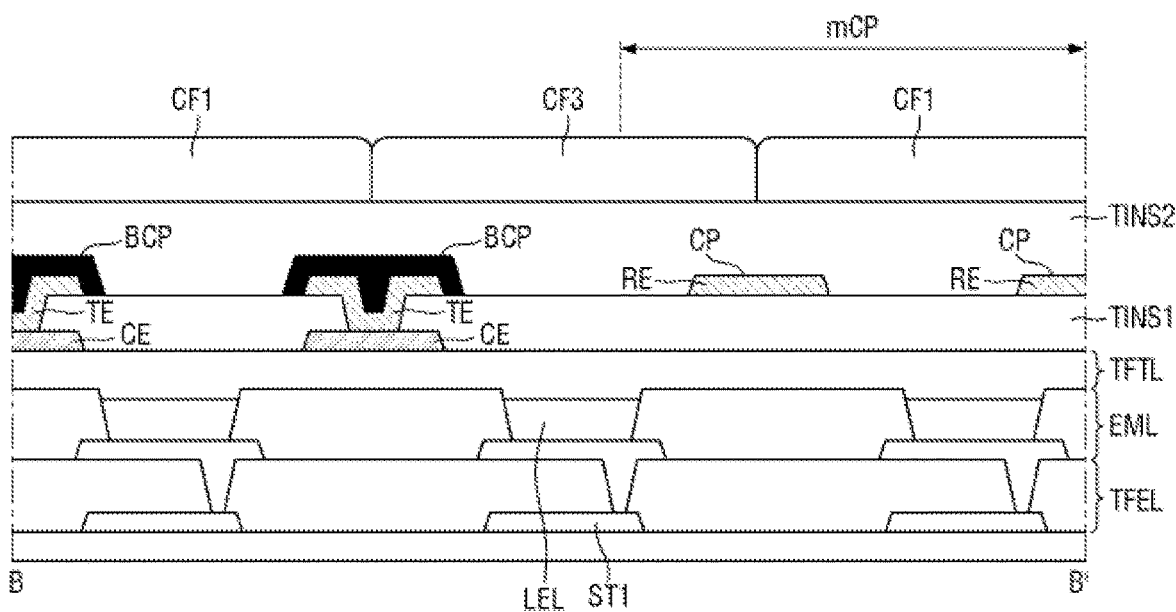
FIG. 20 is a cross-sectional view illustrating a cross-sectional structure taken along line B-B' of FIG. 19.

FIG. 20 is a cross-sectional view illustrating a cross-sectional structure taken along line B-B' of FIG. 19.

As illustrated in FIG. 20, the driving electrodes TE, the sensing electrodes RE, and the dummy electrodes DE may be patterned and disposed on the first touch insulating layer TINS1.

The light blocking pattern layers BCP are formed on some of the front surfaces of the driving electrodes TE, the sensing electrodes RE, and the dummy electrodes DE. In this case, the light blocking pattern layer BCP may be formed by covering the front surfaces of the plurality of dummy electrodes DE, the plurality of driving electrodes TE, and the plurality of sensing electrodes RE except for the preset shapes of the code patterns CP. Accordingly, the code patterns CP are formed in an embossed type having high reflectivity by exposing the front surfaces of the plurality of dummy electrodes DE, the plurality of driving electrodes TE, and the plurality of sensing electrodes RE in a preset planar code shape.

The width, size, and length of the embossed type code patterns CP in at least one direction may be set and formed to correspond to the size, sensing area, arrangement, and the like of each light receiving unit 21(*b*) or each optical image sensor included in the code detection unit 21 of the touch input device 20. Accordingly, the code detection unit 21 of the touch input device 20 may sense the code patterns CP according to the shape of the infrared rays reflected with a preset width, size, and length.

According to the display device and the touch input system including the same according to the embodiments of the present disclosure, without complicated calculations and corrections by using the code patterns CP of the display panel 100, touch coordinate data of the touch input device 20 may be generated, and a touch input of the touch input device may be performed.

In addition, according to the display device and the touch input system including the same according to the embodiments, by enhancing the stacking and arrangement structure of the touch electrodes SEN, the light blocking pattern layer BCP, and the connection electrodes CE, a process of forming an insulating layer may be omitted, and the code patterns CP may be formed using a material for forming the light blocking pattern layer BCP. Accordingly, a manufacturing process of the display panel 100 including the code patterns CP may be simplified and manufacturing costs may be reduced.

In addition, by enhancing the arrangement and formation structure of the code patterns CP formed of the material for forming the light blocking pattern layer BCP on the touch electrodes SEN or the insulating layer, the recognition rate and accuracy of the code patterns CP may be increased.

Figure 21:
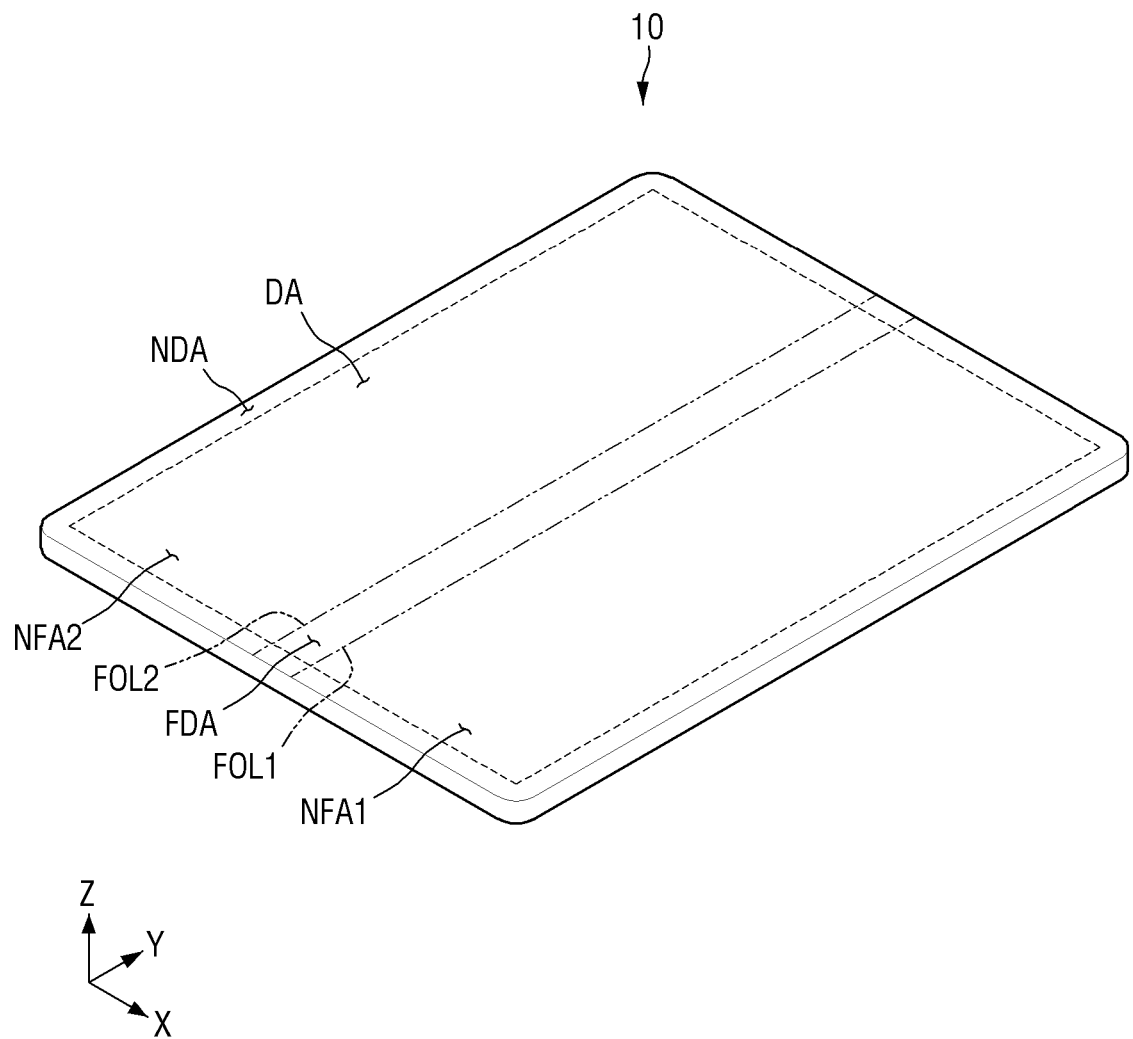
FIGS. 21 and 22 are perspective views illustrating a display device according to an embodiment of the present disclosure.
Figure 22:
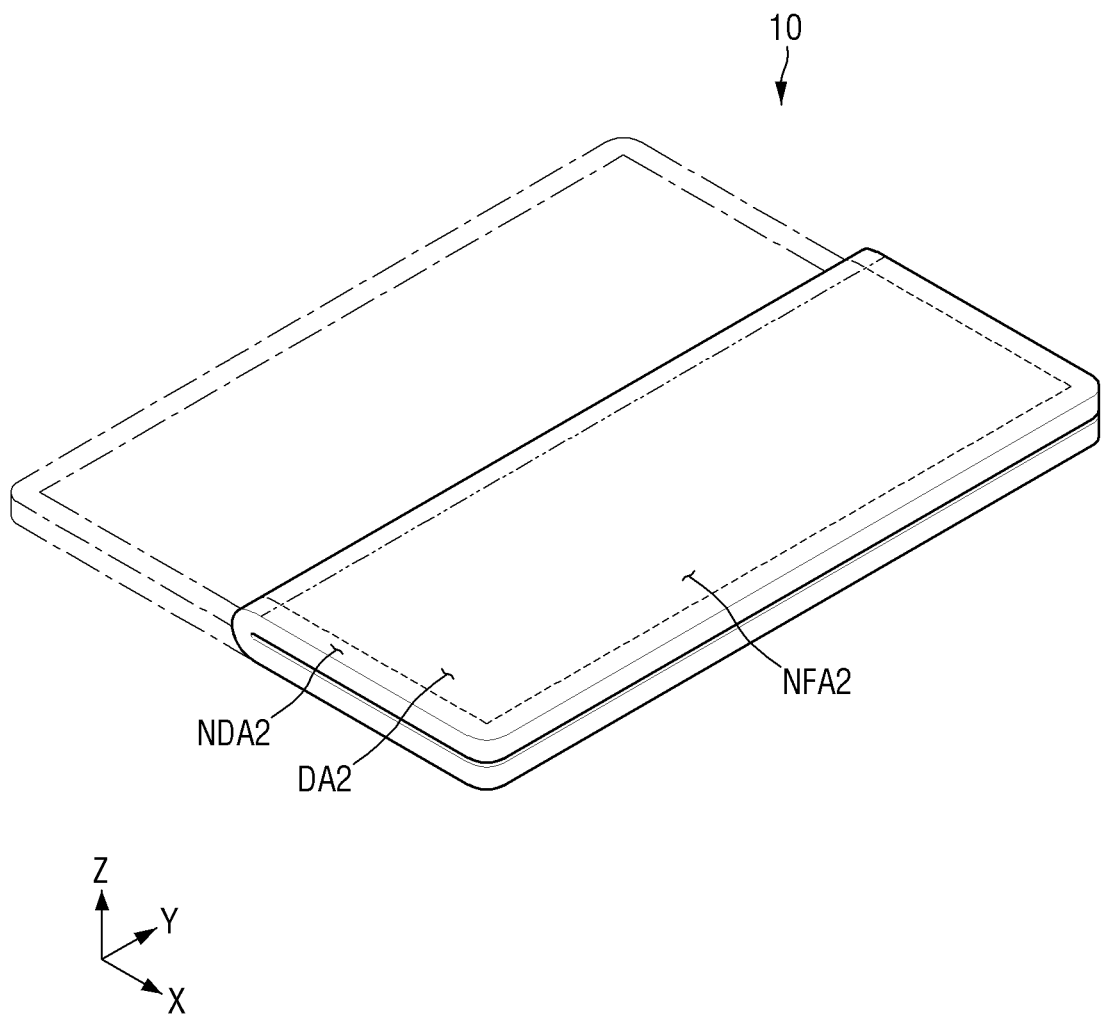

FIGS. 21 and 22 are perspective views illustrating a display device according to another embodiment of the present disclosure.

FIGS. 21 and 22 illustrate that the display device 10 is a foldable display device that is folded in the first direction (X-axis direction). The display device 10 may maintain both a folded state and an unfolded state. The display device 10 may be folded in an in-folding manner in which a front surface thereof is disposed inside so as to protect the display surface when in the folded state. When the display device 10 is bent or folded in the in-folding manner, the front surfaces of the display device 10 may face each other. Alternatively, the display device 10 may be folded in an out-folding manner in which the front surface thereof is disposed on the outside and therefore remains viewable even when in the folded state. When the display device 10 is bent or folded in the out-folding manner, the rear surfaces of the display device 10 may face each other.

A first non-folding area NFA1 may be disposed on one side, for example, a right side of a folding area FDA. A second non-folding area NFA2 may be disposed on the other side, for example, a left side of the folding area FDA. The touch sensing unit TSU according to the embodiment of the present specification may be formed and disposed on the first non-folding area NFA1 and the second non-folding area NFA2, respectively.

A first folding line FOL1 and a second folding line FOL2 may extend in the second direction (Y-axis direction), and the display device 10 may be folded in the first direction (X-axis direction). Accordingly, since a length of the display device 10 in the first direction (X-axis direction) may be reduced by about half, it may be convenient for the user to carry the display device 10.

Meanwhile, the extending direction of the first folding line FOL1 and the extending direction of the second folding line FOL2 are not necessarily limited to the second direction (Y-axis direction). For example, the first folding line FOL1 and the second folding line FOL2 may extend in the first direction (X-axis direction), and the display device 10 may be folded in the second direction (Y-axis direction). In this case, a length of the display device 10 in the second direction (the Y-axis direction) may be reduced by about half. Alternatively, the first folding line FOL1 and the second folding line FOL2 may extend in a diagonal direction between the first direction (X-axis direction) and the second direction (Y-axis direction) of the display device 10. In this case, the display device 10 may be folded in a triangular shape.

When the first folding line FOL1 and the second folding line FOL2 extend in the second direction (Y-axis direction), a length of the folding area FDA in the first direction (X-axis direction) may be shorter than a length thereof in the second direction (Y-axis direction). In addition, a length of the first non-folding area NFA1 in the first direction (X-axis direction) may be longer than the length of the folding area FDA in the first direction (X-axis direction). A length of the second non-folding area NFA2 in the first direction (X-axis direction) may be longer than the length of the folding area FDA in the first direction (X-axis direction).

A first display area DA1 may be disposed on the front surface of the display device 10. The first display area DA1 may overlap the folding area FDA, the first non-folding area NFA1, and the second non-folding area NFA2. Therefore, when the display device 10 is unfolded, an image may be displayed in a front direction in the folding area FDA, the first non-folding area NFA1, and the second non-folding area NFA2 of the display device 10.

A second display area DA2 may be disposed on the rear surface of the display device 10. The second display area DA2 may overlap the second non-folding area NFA2. Therefore, when the display device 10 is folded, an image may be displayed in the front direction in the second non-folding area NFA2 of the display device 10.

FIGS. 21 and 22 illustrate that a through hole TH in which a camera SDA is formed is disposed in the first non-folding area NFA1, but the present disclosure is not necessarily limited thereto. The through hole TH or the camera SDA may be disposed in the second non-folding area NFA2 or the folding area FDA.

Figure 23:
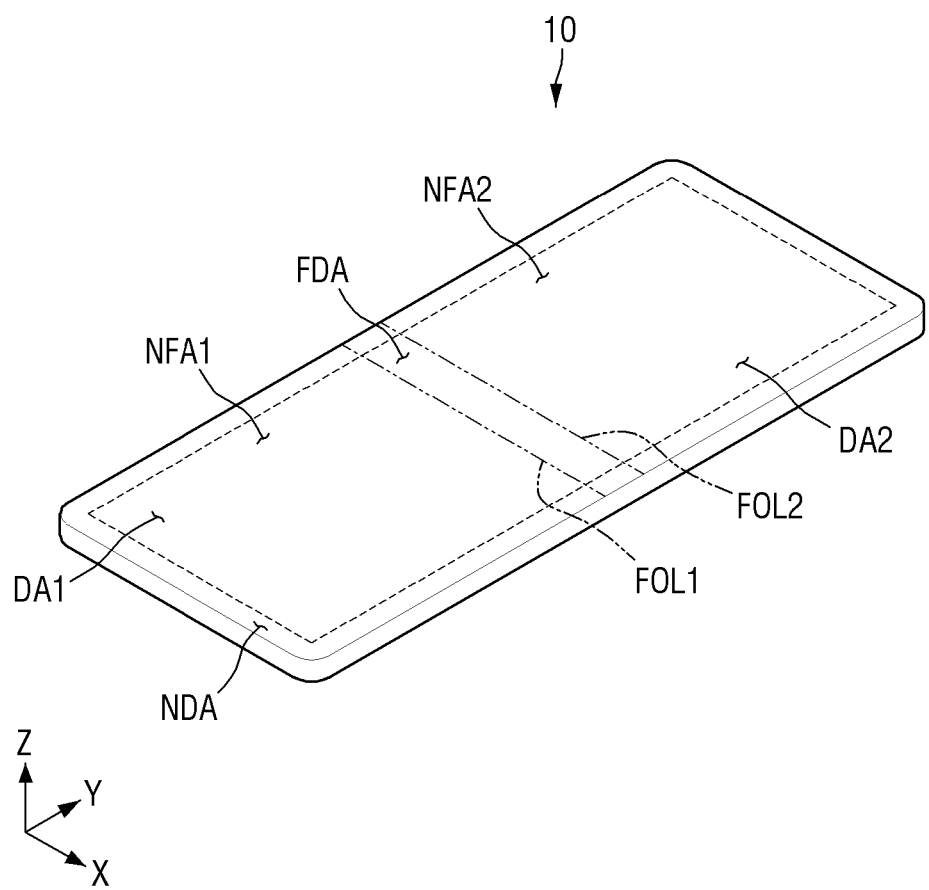
FIGS. 23 and 24 are perspective views illustrating a display device according to an embodiment of the present disclosure.
Figure 24:
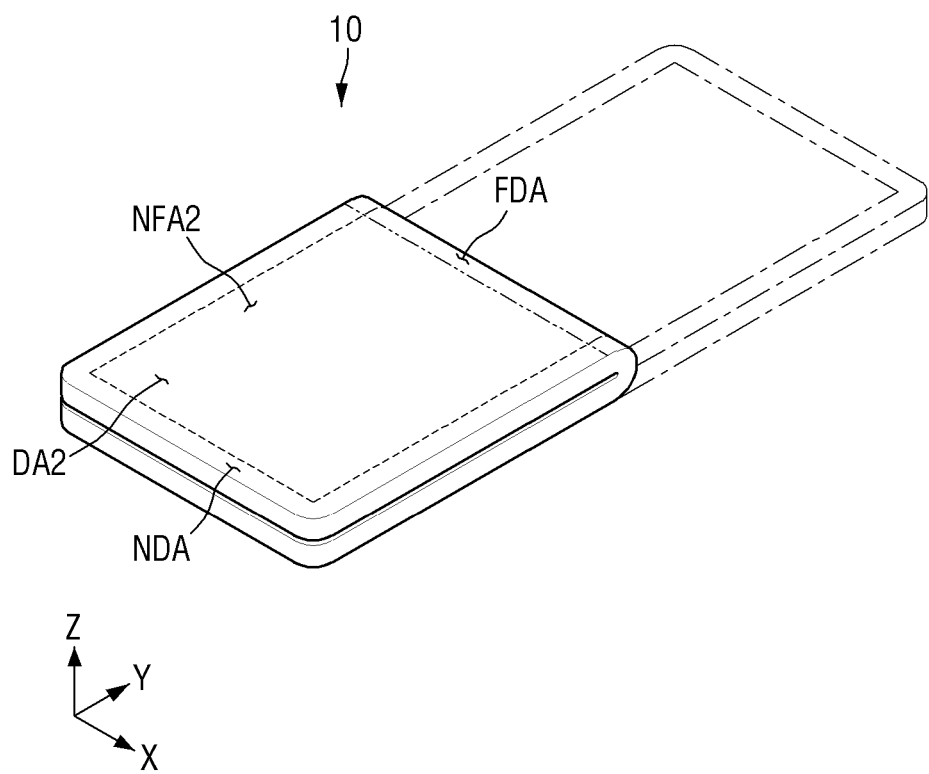

FIGS. 23 and 24 are perspective views illustrating a display device according to an embodiment of the present disclosure.

FIGS. 23 and 24 illustrate that the display device 10 is a foldable display device that is folded in the second direction (Y-axis direction). The display device 10 may maintain both a folded state and an unfolded state. The display device 10 may be folded in an in-folding manner in which a front surface thereof is disposed inside. When the display device 10 is bent or folded in the in-folding manner, the front surfaces of the display device 10 may face each other. Alternatively, the display device 10 may be folded in an out-folding manner in which the front surface thereof is disposed on the outside. When the display device 10 is bent or folded in the out-folding manner, the rear surfaces of the display device 10 may face each other.

The display device 10 may include a folding area FDA, a first non-folding area NFA1, and a second non-folding area NFA2. The folding area FDA may be an area in which the display device 10 is folded, and the first non-folding area NFA1 and the second non-folding area NFA2 may be areas in which the display device 10 is not folded. The first non-folding area NFA1 may be disposed on one side, for example, a lower side of the folding area FDA. The second non-folding area NFA2 may be disposed on the other side, for example, an upper side of the folding area FDA.

The touch sensing unit TSU, according to the embodiment of the present specification, may be formed and disposed on the first non-folding area NFA1 and the second non-folding area NFA2, respectively.

The folding area FDA may be an area bent with a predetermined curvature at the first folding line FOL1 and the second folding line FOL2. Therefore, the first folding line FOL1 may be a boundary between the folding area FDA and the first non-folding area NFA1, and the second folding line FOL2 may be a boundary between the folding area FDA and the second non-folding area NFA2.

As illustrated in FIGS. 23 and 24, the first folding line FOL1 and the second folding line FOL2 may extend in the first direction (X-axis direction), and the display device 10 may be folded in the second direction (Y-axis direction). Accordingly, since a length of the display device 10 in the second direction (Y-axis direction) may be reduced by about half, it may be more convenient for the user to carry the display device 10.

Meanwhile, the extending direction of the first folding line FOL1 and the extending direction of the second folding line FOL2 are not necessarily limited to the first direction (X-axis direction). For example, the first folding line FOL1 and the second folding line FOL2 may extend in the second direction (Y-axis direction), and the display device 10 may be folded in the first direction (X-axis direction). In this case, a length of the display device 10 in the first direction (the X-axis direction) may be reduced by about half. Alternatively, the first folding line FOL1 and the second folding line FOL2 may extend in a diagonal direction between the first direction (X-axis direction) and the second direction (Y-axis direction) of the display device 10. In this case, a square display device 10 may be folded in a triangular shape.

When the first folding line FOL1 and the second folding line FOL2 extend in the first direction (X-axis direction) as illustrated in FIGS. 23 and 24, a length of the folding area FDA in the second direction (Y-axis direction) may be shorter than a length thereof in the first direction (X-axis direction). In addition, a length of the first non-folding area NFA1 in the second direction (Y-axis direction) may be longer than the length of the folding area FDA in the second direction (Y-axis direction). In addition, a length of the second non-folding area NFA2 in the second direction (Y-axis direction) may be longer than the length of the folding area FDA in the second direction (Y-axis direction).

A first display area DA1 may be disposed on the front surface of the display device 10. The first display area DA1 may overlap the folding area FDA, the first non-folding area NFA1, and the second non-folding area NFA2. Therefore, when the display device 10 is unfolded, an image may be displayed in a front direction in the folding area FDA, the first non-folding area NFA1, and the second non-folding area NFA2 of the display device 10.

A second display area DA2 may be disposed on the rear surface of the display device 10. The second display area DA2 may overlap the second non-folding area NFA2. Therefore, when the display device 10 is folded, an image may be displayed in the front direction in the second non-folding area NFA2 of the display device 10.

FIGS. 23 and 24 illustrate that a through hole TH in which a camera SDA is disposed is disposed in the second non-folding area NFA2, but the present disclosure is not necessarily limited thereto. The through hole TH may be disposed in the first non-folding area NFA1 or the folding area FDA.

In concluding the detailed description, those skilled in the art will appreciate that many variations and modifications can be made to the embodiments described herein without departing from the principles of the present disclosure.

What is claimed is:

1. A display device, comprising:
 a display unit including a plurality of light emitting areas;
 a plurality of touch electrodes disposed between the plurality of light emitting areas;
 a plurality of light blocking pattern layers covering intersection areas of driving electrodes and sensing electrodes among the plurality of touch electrodes;
 a plurality of connection electrodes disposed on the plurality of light blocking pattern layers and electrically connecting the driving electrodes or the sensing electrodes adjacent to each other; and
 a plurality of code patterns covering a top surface and side surfaces of at least some of the sensing electrodes and including a same material as the plurality of light blocking pattern layers.

2. The display device of claim 1, wherein the plurality of code patterns is formed by covering some front surfaces of the driving electrodes and the sensing electrodes with a preset planar code shape, or is formed in the preset planar code shape in each code area by forming the driving electrodes and the sensing electrodes in a cut shape.

3. The display device of claim 2, wherein the planar code shape of the plurality of code patterns has a closed loop shape of a rectangle, a square, a circle, and/or a rhombus, an open loop shape at least partially surrounding a portion of at least one light emitting area among the plurality of light emitting areas, and/or a shape of a straight line having a preset length.

4. The display device of claim 1, wherein the driving electrodes, the sensing electrodes, and dummy electrodes are formed in a mesh structure surrounding between and around the plurality of light emitting areas, and
 wherein the plurality of light blocking pattern layers is formed in preset pattern shapes on some front surfaces of the driving electrodes, the sensing electrodes, and the dummy electrodes other than intersection areas of the driving electrodes and the sensing electrodes.

5. The display device of claim 4, wherein the plurality of connection electrodes is formed on a front layer on which the driving electrodes and the sensing electrodes are formed with the light blocking pattern layer interposed therebetween and electrically insulated from the sensing electrodes, and are electrically connected to exposed areas of the driving electrodes in which the light blocking pattern layer is not formed on some of the front surfaces and some of the front surfaces are exposed.

6. The display device of claim 4, wherein the plurality of light blocking pattern layers are formed and disposed in a shape of a straight line having a preset length, an open loop shape surrounding only a portion of at least one light emitting area among the plurality of light emitting areas, and/or a mesh shape.

7. The display device of claim 4, wherein the driving electrodes, the sensing electrodes, and the dummy electrodes are respectively formed in a shape in which some electrodes are cut to form planar code areas in which the electrodes are not formed.

8. The display device of claim 7, wherein the plurality of code patterns are respectively formed in a preset position code shape in the planar code areas in which the driving electrodes, the sensing electrodes, and the dummy electrodes are not formed.

9. The display device of claim 4, wherein the plurality of light blocking pattern layers cover the front surfaces of the driving electrodes, the sensing electrodes, and the dummy electrodes except for preset shapes and formation areas for the plurality of code patterns.

10. The display device of claim 9, wherein the plurality of code patterns are embossed in which front surfaces of the driving electrodes, the sensing electrodes, and the dummy electrodes are exposed in a preset position code shape.

11. A touch input system, comprising:
a display device displaying an image; and
a touch input device sensing a touch to the display device,
wherein the display device includes:
a display unit including a plurality of light emitting areas;
a plurality of touch electrodes disposed between the plurality of light emitting areas and sensing the touch;
a plurality of light blocking pattern layers covering intersection areas of driving electrodes and sensing electrodes among the plurality of touch electrodes;
a plurality of connection electrodes formed on the plurality of light blocking pattern layers and electrically connecting the driving electrodes or the sensing electrodes adjacent to each other; and
a plurality of code patterns covering a top surface and side surfaces of at least some of the sensing electrodes and including a same material as the plurality of light blocking pattern layers.

12. The touch input system of claim 11, wherein the touch input device includes:
a code detection unit sensing the plurality of code patterns,
a code processor receiving shape data for the plurality of code patterns to extract data codes corresponding to shapes of the plurality of code patterns, and generate coordinate data corresponding to the data codes; and
a communication module transmitting the coordinate data to the display device.

13. A display device, comprising:
a display unit including a plurality of light emitting areas;
a plurality of touch electrodes disposed among light emitting areas of the plurality of light emitting areas;
a plurality of connection electrodes disposed on a rear surface of the plurality of touch electrodes with a touch insulating layer interposed therebetween and electrically connecting driving electrodes or sensing electrodes adjacent to each other among the plurality of touch electrodes through a plurality of contact holes;
a plurality of light blocking pattern layers formed in a preset pattern shape on some of front surfaces of the driving electrodes, the sensing electrodes, and dummy electrodes; and
a plurality of code patterns including a same material as the plurality of light blocking pattern layers,
wherein the driving electrodes, the sensing electrodes, and the dummy electrodes have a shape in which some electrodes are cut to form planar code areas in which the electrodes are not formed.

14. The display device of claim 13, wherein the plurality of code patterns cover some of front surfaces of the driving electrodes and the sensing electrodes with a preset planar code shape, or have the preset planar code shape in each code area by forming the driving electrodes and the sensing electrodes in a cut shape.

15. The display device of claim 13, wherein the plurality of code patterns are respectively formed in a preset position code shape in the planar code areas in which the driving electrodes, the sensing electrodes, and the dummy electrodes are not formed.

16. The display device of claim 13, wherein the plurality of light blocking pattern layers covers front surfaces of the driving electrodes, the sensing electrodes, and the dummy electrodes except for preset shapes and formation areas for the plurality of code patterns.

17. The display device of claim 16, wherein the plurality of code patterns are embossed in which front surfaces of the driving electrodes, the sensing electrodes, and the dummy electrodes are exposed in a preset planar code shape.

18. A touch input system, comprising:
a display device displaying an image; and
a touch input device sensing a touch to the display device,
wherein the display device includes:
a display unit including a plurality of light emitting areas,
a plurality of touch electrodes disposed between light emitting areas of the plurality of light emitting areas;
connection electrodes disposed on a rear surface of the plurality of touch electrodes with a touch insulating layer interposed therebetween and electrically connecting driving electrodes or sensing electrodes adjacent to each other among the plurality of touch electrodes through a plurality of contact holes;
a plurality of light blocking pattern layers having a preset pattern shape on some front surfaces of the driving electrodes, the sensing electrodes, and dummy electrodes; and
a plurality of code patterns covering a top surface and side surfaces of at least some of the sensing electrodes and including a same material as the plurality of light blocking pattern layers.

19. The touch input system of claim 18, wherein the touch input device includes:
a code detection unit sensing the plurality of code patterns;
a code processor receiving shape data for the plurality of code patterns and extracting data codes corresponding to shapes of the plurality of code patterns, and generating coordinate data corresponding to the data codes; and
a communication module transmitting the coordinate data to the display device.

20. The display device of claim 1, wherein the light blocking pattern layers and the code patterns are each disposed over the sensing electrodes with the light blocking patterns having the connection patterns disposed thereover and the code patterns not having the connection patterns disposed thereover, in a cross-sectional view.

* * * * *